(12) United States Patent
Kim et al.

(10) Patent No.: US 9,805,814 B2
(45) Date of Patent: Oct. 31, 2017

(54) MEMORY SYSTEM PERFORMING WEAR LEVELING USING AVERAGE ERASE COUNT VALUE AND OPERATING METHOD THEREOF

(71) Applicant: SK hynix Inc., Gyeonggi-do (KR)

(72) Inventors: Jin-Woong Kim, Gyeonggi-do (KR); Byeong-Gyu Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/162,316

(22) Filed: May 23, 2016

(65) Prior Publication Data

US 2017/0186494 A1    Jun. 29, 2017

(30) Foreign Application Priority Data

Dec. 29, 2015    (KR) ........................ 10-2015-0188681

(51) Int. Cl.
*G11C 16/10*    (2006.01)
*G11C 16/34*    (2006.01)
(Continued)

(52) U.S. Cl.
CPC ...... *G11C 16/3495* (2013.01); *G06F 11/1008* (2013.01); *G11C 16/10* (2013.01); *G11C 16/26* (2013.01)

(58) Field of Classification Search
CPC ..... G11C 16/3495; G11C 16/26; G11C 16/10; G06F 11/1008
See application file for complete search history.

(56) References Cited

U.S. PATENT DOCUMENTS

2011/0197014 A1*   8/2011   Yeh ..................... G06F 12/0246
                                                                 711/103
2011/0246705 A1*   10/2011   Mudama ............ G11C 16/3495
                                                                 711/103
(Continued)

FOREIGN PATENT DOCUMENTS

KR    1020100050260      5/2010
KR    1020140096875      8/2014

*Primary Examiner* — Khamdan Alrobaie
(74) *Attorney, Agent, or Firm* — IP & T Group LLP

(57) ABSTRACT

A memory system may include a memory device including $0^{th}$ to N-$1^{th}$ memory blocks, wherein N is a positive integer; and a controller having a first list and a second list, wherein the first list includes $0^{th}$ to N-$1^{th}$ erase count values respectively for the $0^{th}$ to N-$1^{th}$ memory blocks, wherein the second list includes $0^{th}$ to N-$1^{th}$ difference values respectively for the $0^{th}$ to N-$1^{th}$ memory blocks, wherein each of the $0^{th}$ to N-$1^{th}$ difference values is a difference between an average value of the $0^{th}$ to N-$1^{th}$ erase count values and each of the $0^{th}$ to N-$1^{th}$ erase count values, wherein the controller selects a source block and a target block among the $0^{th}$ to N-$1^{th}$ memory blocks depending on the $0^{th}$ to N-$1^{th}$ erase count values included in the first list and the $0^{th}$ to N-$1^{th}$ difference values included in the second list to perform a wear leveling between the source block and the target block.

16 Claims, 15 Drawing Sheets

(51) Int. Cl.
*G11C 16/26* (2006.01)
*G06F 11/10* (2006.01)

(56) References Cited

U.S. PATENT DOCUMENTS

| | | | |
|---|---|---|---|
| 2012/0173796 A1* | 7/2012 | Shen | G06F 12/0246 |
| | | | 711/103 |
| 2013/0346676 A1* | 12/2013 | Kim | G06F 12/0246 |
| | | | 711/103 |
| 2014/0173188 A1* | 6/2014 | Sakamoto | G06F 12/0246 |
| | | | 711/103 |
| 2015/0092495 A1* | 4/2015 | Jung | G11C 16/24 |
| | | | 365/185.12 |

* cited by examiner

FIG. 13A

BEFORE FIRST WEAR LEVELING OPERATION

| MEMORY BLOCK | 0 | 1 | 2 | 3 | 4 | 5 | 6 | 7 | 8 | 9 |
|---|---|---|---|---|---|---|---|---|---|---|
| STATE | FREE | NORMAL DATA | NORMAL DATA | NORMAL DATA | NORMAL DATA | COLD DATA | COLD DATA | COLD DATA | FREE | NORMAL DATA |
| FIRST LIST | 100 | 78 | 78 | 80 | 80 | 0 | 2 | 2 | 100 | 80 |
| SECOND LIST | INIT | INIT | INIT | INIT | INIT | INIT | INIT | INIT | INIT | INIT |

| AVERAGE VALUE OF ALL OF VALUES INCLUDED IN FIRST LIST : 60 |
|---|
| SUM OF VALUES INCLUDED IN FIRST LIST : 600 |
| <0> IS SELECTED AS SOURCE BLOCK<br><5> IS SELECTED AS TARGET BLOCK |

FIG. 13B

AFTER FIRST WEAR LEVELING OPERATION IS PERFORMED – FIRST EMBODIMENT

| MEMORY BLOCK | 0 | 1 | 2 | 3 | 4 | 5 | 6 | 7 | 8 | 9 |
|---|---|---|---|---|---|---|---|---|---|---|
| STATE | COLD DATA | NORMAL DATA | NORMAL DATA | NORMAL DATA | NORMAL DATA | FREE | COLD DATA | COLD DATA | FREE | NORMAL DATA |
| FIRST LIST | 100 | 78 | 78 | 80 | 80 | 1 | 2 | 2 | 100 | 80 |
| SECOND LIST | INIT | INIT | INIT | INIT | INIT | 60 | INIT | INIT | INIT | INIT |

| AVERAGE VALUE OF ALL OF VALUES INCLUDED IN FIRST LIST : 60 |
|---|
| SUM OF VALUES INCLUDED IN FIRST LIST : 601 |
| <0> IS SELECTED AS SOURCE BLOCK<br><5> IS SELECTED AS TARGET BLOCK |

FIG. 13C

AFTER FIRST WEAR LEVELING OPERATION IS PERFORMED - SECOND EMBODIMENT

| MEMORY BLOCK | 0 | 1 | 2 | 3 | 4 | 5 | 6 | 7 | 8 | 9 |
|---|---|---|---|---|---|---|---|---|---|---|
| STATE | COLD DATA | NORMAL DATA | NORMAL DATA | NORMAL DATA | NORMAL DATA | FREE | COLD DATA | COLD DATA | FREE | NORMAL DATA |
| FIRST LIST | 100 | 78 | 78 | 80 | 80 | 1 | 2 | 2 | 100 | 80 |
| SECOND LIST | INIT | INIT | INIT | INIT | INIT | 59 | INIT | INIT | INIT | INIT |

| |
|---|
| AVERAGE VALUE OF ALL OF VALUES INCLUDED IN FIRST LIST : 60 |
| SUM OF VALUES INCLUDED IN FIRST LIST : 601 |
| <0> IS SELECTED AS SOURCE BLOCK<br><5> IS SELECTED AS TARGET BLOCK |

FIG. 14A

BEFORE SECOND WEAR LEVELING OPERATION

| MEMORY BLOCK | 0 | 1 | 2 | 3 | 4 | 5 | 6 | 7 | 8 | 9 |
|---|---|---|---|---|---|---|---|---|---|---|
| STATE | COLD DATA | NORMAL DATA | NORMAL DATA | NORMAL DATA | NORMAL DATA | FREE | COLD DATA | COLD DATA | FREE | NORMAL DATA |
| FIRST LIST | 100 | 78 | 78 | 80 | 80 | 1 | 2 | 2 | 100 | 80 |
| SECOND LIST | INIT | INIT | INIT | INIT | INIT | 60 | INIT | INIT | INIT | INIT |

| |
|---|
| AVERAGE VALUE OF ALL OF VALUES INCLUDED IN FIRST LIST : 60 |
| SUM OF VALUES INCLUDED IN FIRST LIST : 601 |
| <8> IS SELECTED AS SOURCE BLOCK<br><6> IS SELECTED AS TARGET BLOCK |
| <0> IS NOT SELECTED AS SOURCE BLOCK IN SECOND WEAR LEVELING OPERATION BECAUSE IT HAS BEEN SELECTED AS SOURCE BLOCK IN FIRST WEAR LEVELING OPERATION |

FIG. 14B

AFTER SECOND WEAR LEVELING OPERATION IS PERFORMED - FIRST EMBODIMENT

| MEMORY BLOCK | 0 | 1 | 2 | 3 | 4 | 5 | 6 | 7 | 8 | 9 |
|---|---|---|---|---|---|---|---|---|---|---|
| STATE | COLD DATA | NORMAL DATA | NORMAL DATA | NORMAL DATA | NORMAL DATA | FREE | FREE | COLD DATA | COLD DATA | NORMAL DATA |
| FIRST LIST | 100 | 78 | 78 | 80 | 80 | 1 | 3 | 2 | 100 | 80 |
| SECOND LIST | INIT | INIT | INIT | INIT | INIT | 60 | 58 | INIT | INIT | INIT |

| |
|---|
| AVERAGE VALUE OF ALL OF VALUES INCLUDED IN FIRST LIST : 60 |
| SUM OF VALUES INCLUDED IN FIRST LIST : 602 |
| <8> IS SELECTED AS SOURCE BLOCK<br><6> IS SELECTED AS TARGET BLOCK |
| <0> IS NOT SELECTED AS SOURCE BLOCK IN SECOND WEAR LEVELING OPERATION BECAUS IT HAS BEEN SELECTED AS SOURCE BLOCK IN FIRST WEAR LEVELING OPERATION |

FIG. 14C

AFTER SECOND WEAR LEVELING OPERATION IS PERFORMED – SECOND EMBODIMENT

| MEMORY BLOCK | 0 | 1 | 2 | 3 | 4 | 5 | 6 | 7 | 8 | 9 |
|---|---|---|---|---|---|---|---|---|---|---|
| STATE | COLD DATA | NORMAL DATA | NORMAL DATA | NORMAL DATA | NORMAL DATA | FREE | FREE | COLD DATA | COLD DATA | NORMAL DATA |
| FIRST LIST | 100 | 78 | 78 | 80 | 80 | 1 | 3 | 2 | 100 | 80 |
| SECOND LIST | INIT | INIT | INIT | INIT | INIT | 59 | 57 | INIT | INIT | INIT |

| |
|---|
| AVERAGE VALUE OF ALL OF VALUES INCLUDED IN FIRST LIST : 60 |
| SUM OF VALUES INCLUDED IN FIRST LIST : 602 |
| <8> IS SELECTED AS SOURCE BLOCK<br><6> IS SELECTED AS TARGET BLOCK |
| <0> IS NOT SELECTED AS SOURCE BLOCK IN SECOND WEAR LEVELING OPERATION BECAUSE IT HAS BEEN SELECTED AS SOURCE BLOCK IN FIRST WEAR LEVELING OPERATION |

US 9,805,814 B2

MEMORY SYSTEM PERFORMING WEAR LEVELING USING AVERAGE ERASE COUNT VALUE AND OPERATING METHOD THEREOF

CROSS-REFERENCE TO RELATED APPLICATION

This application claims priority under 35 U.S.C. §119 to Korean Patent Application No. 10-2015-0188681 filed on Dec. 29, 2015 the disclosure of which is herein incorporated by reference in its entirety.

TECHNICAL FIELD

Exemplary embodiments relate to a semiconductor design technology, and more particularly, to a memory system performing a wear leveling operation and an operating method thereof.

DISCUSSION OF THE RELATED ART

The computer environment paradigm has shifted to ubiquitous computing systems that can be used anywhere and at any time. Thus, portable electronic devices such as mobile phones, digital cameras, and notebook computers are widely used. These portable electronic devices may use a memory system having a memory device for storing data, that is, a data storage device. A data storage device may be used as a main or an auxiliary memory device of a portable electronic device.

Data storage devices using semiconductor memory devices provide excellent stability, durability, high information access speed, and low power consumption since they have no moving parts. Examples of data storage devices having such advantages include universal serial bus (USB) memory devices, memory cards having various interfaces, and solid state drives (SSD).

SUMMARY

Various embodiments are directed to a memory system capable of enhancing the operating performance of memory blocks and extending the lifetime thereof through a wear leveling operation, and an operating method of the memory system.

In an embodiment, a memory system may include: a memory device including $0^{th}$ to $N-1^{th}$ memory blocks, N is a positive integer; and a controller having a first list and a second list, the first list may include $0^{th}$ to $N-1^{th}$ erase count values respectively for the $0^{th}$ to $N-1^{th}$ memory blocks, the second list may include $0^{th}$ to $N-1^{th}$ difference values respectively for the $0^{th}$ to $N-1^{th}$ memory blocks, each of the $0^{th}$ to $N-1^{th}$ difference values may be a difference between an average value of the $0^{th}$ to $N-1^{th}$ erase count values and each of the $0^{th}$ to $N-1^{th}$ erase count values, the controller may select a source block and a target block among the $0^{th}$ to $N-1^{th}$ memory blocks depending on the $0^{th}$ to $N-1^{th}$ erase count values included in the first list and the $0^{th}$ to $N-1^{th}$ difference values included in the second list to perform a wear leveling between the source block and the target block.

The controller may update an $L^{th}$ erase count value among the $0^{th}$ to $N-1^{th}$ erase count values included in the first list, when performing an erase operation on the $L^{th}$ memory block among the $0^{th}$ to $N-1^{th}$ memory blocks, L is an integer selected between 0 to N-1, inclusive.

The controller may determine whether an $M^{th}$ memory block meets a target block condition, may select the $M^{th}$ memory block as the target block when the target block condition is met, and may update the $M^{th}$ difference value among the $0^{th}$ to $N-1^{th}$ difference values included in the second list, M is an integer selected between 0 to N-1, inclusive.

The target block condition may include first and second conditions, the first condition may be that the $M^{th}$ difference value is less than a difference between the average value of the $0^{th}$ to $N-1^{th}$ erase count values and the $M^{th}$ erase count value, the second condition may be that the $M^{th}$ erase count value is the smallest value among the $0^{th}$ to $N-1^{th}$ erase count values.

The $0^{th}$ to $N-1^{th}$ difference values may be set to $0^{th}$ to $N-1^{th}$ initial values, respectively, the controller may update the $M^{th}$ difference value to the difference between the average value of the $0^{th}$ to $N-1^{th}$ erase count values and the $M^{th}$ erase count value, after selecting the $M^{th}$ memory block as the target block and before performing the wear leveling between the source block and the $M^{th}$ memory block selected as the target block.

The $0^{th}$ to $N-1^{th}$ difference values may be set to $0^{th}$ to $N-1^{th}$ initial values, respectively, the controller may update the $M^{th}$ difference value to the difference between the average value of the $0^{th}$ to $N-1^{th}$ erase count values and the $M^{th}$ erase count value, after performing the wear leveling between the source block and the $M^{th}$ memory block selected as the target block.

The average value may be a quotient which is obtained by dividing a sum of the $0^{th}$ to $N-1^{th}$ erase count values by N, and the controller may update the sum of the $0^{th}$ to $N-1^{th}$ erase count values and the average value when performing an erase operation on at least one of the $0^{th}$ to $N-1^{th}$ memory blocks.

The controller may determine whether a $K^{th}$ memory block meets a source block condition, the controller may select the $K^{th}$ memory block as the source block when the source block condition is met, the source block condition may include that a $K^{th}$ erase count value is the greatest among the $0^{th}$ to $N-1^{th}$ erase count values, and K is an integer selected between 0 to N-1, inclusive.

The controller may determine whether a $K^{th}$ memory block meets a source block condition, the controller may select the $K^{th}$ memory block as the source block when the source block condition is met, the source block condition may include first and second source block conditions, the first source block condition is that a $K^{th}$ erase count value is the greatest among the $0^{th}$ to $N-1^{th}$ erase count values, the second source block condition is that the $K^{th}$ memory block is in a free block state, and K is an integer selected between 0 to N-1, inclusive.

The wear leveling between the source block and the target block may include: copying data stored in the target block into the source block; and erasing the data from the target block.

In an embodiment, a method of operating a memory system may include: generating a first list including $0^{th}$ to $N-1^{th}$ erase count values for the $0^{th}$ to $N-1^{th}$ memory blocks, wherein N is a positive integer; generating a second list including $0^{th}$ to $N-1^{th}$ difference values for $0^{th}$ to $N-1^{th}$ memory blocks, wherein each of the $0^{th}$ to $N-1^{th}$ difference values is obtained by a difference between an average of the $0^{th}$ to $N-1^{th}$ erase count values and each of the $0^{th}$ to $N-1^{th}$ erase count values; selecting a source block and a target block among the $0^{th}$ to $N-1^{th}$ memory blocks depending on the $0^{th}$ to $N-1^{th}$ erase count values in the first list and the $0^{th}$ to N-1$^{th}$ difference values in the second list; and performing a wear leveling between the source block and the target block.

The method may further include: updating an L$^{th}$ erase count value among the 0$^{th}$ to N-1$^{th}$ erase count values included in the first list, when performing an erase operation on the L$^{th}$ memory block among the 0$^{th}$ to N-1$^{th}$ memory blocks, L is an integer selected between 0 to N-1, inclusive.

The selecting the target block may include: determining whether an M$^{th}$ memory block meets a target block condition and selecting the M$^{th}$ memory block as the target block when the target block condition is met, and updating the M$^{th}$ difference value among the 0$^{th}$ to N-1$^{th}$ difference values included in the second list, wherein M is an integer selected between 0 to N-1, inclusive.

The target block condition may include first and second conditions, the first condition may be that the M$^{th}$ difference value is less than a difference between the average value of the 0$^{th}$ to N-1$^{th}$ erase count values and the M$^{th}$ erase count value, the second condition may be that the M$^{th}$ erase count value is the smallest value among the 0$^{th}$ to N-1$^{th}$ erase count values.

The updating the M$^{th}$ difference value may include: setting the 0$^{th}$ to N-1$^{th}$ difference values to 0$^{th}$ to N-1$^{th}$ initial values, respectively; and updating the M$^{th}$ difference value from to the difference between the average value of the 0$^{th}$ to N-1$^{th}$ erase count values and the M$^{th}$ erase count value, after selecting the M$^{th}$ memory block as the target block and before performing the wear leveling between the source block and the M$^{th}$ memory block selected as the target block.

The updating the M$^{th}$ difference value may include: setting the 0$^{th}$ to N-1$^{th}$ difference values to 0$^{th}$ to N-1$^{th}$ initial values, respectively; and updating the M$^{th}$ difference value to the difference between the average value of the 0$^{th}$ to N-1$^{th}$ erase count values and the M$^{th}$ erase count value, after performing the wear leveling between the source block and the M$^{th}$ memory block selected as the target block.

The method may further include: updating a sum of the 0$^{th}$ to N-1$^{th}$ erase count values and the average value when performing an erase operation on at least one of the 0$^{th}$ to N-1$^{th}$ memory blocks, the average value may be a quotient which is obtained by dividing the sum of the 0$^{th}$ to N-1$^{th}$ erase count values by N.

The selecting the source block may include: determining whether a K$^{th}$ memory block meets a source block condition, selecting the K$^{th}$ memory block as the source block when the source block condition is met, the source block condition may include that a K$^{th}$ erase count value is the greatest among the 0$^{th}$ to N-1$^{th}$ erase count values, and K is an integer selected between 0 to N-1, inclusive.

The selecting the source block may include: determining whether a K$^{th}$ memory block meets a source block condition selecting the K$^{th}$ memory block as the source block when the source block condition is met, the source block condition may include first and second source block conditions, the first source block condition may be that a K$^{th}$ erase count value is the greatest among the 0$^{th}$ to N-1$^{th}$ erase count values, the second source block condition may be that the K$^{th}$ memory block is in a free block state, and K an integer selected between 0 to N-1, inclusive.

The performing wear leveling may include: copying data stored in the target block into the source block; and erasing the data from the target block.

BRIEF DESCRIPTION OF THE DRAWINGS

FIGS. 13A to 13C ere diagrams for describing an example of the wear leveling operation performed in the memory system in accordance with the embodiment shown in FIG. 12.

FIGS. 14A to 14C are diagrams for describing another example of the wear leveling operation performed in the memory system in accordance with the embodiment shown in FIG. 12.

DETAILED DESCRIPTION

Figure 1:
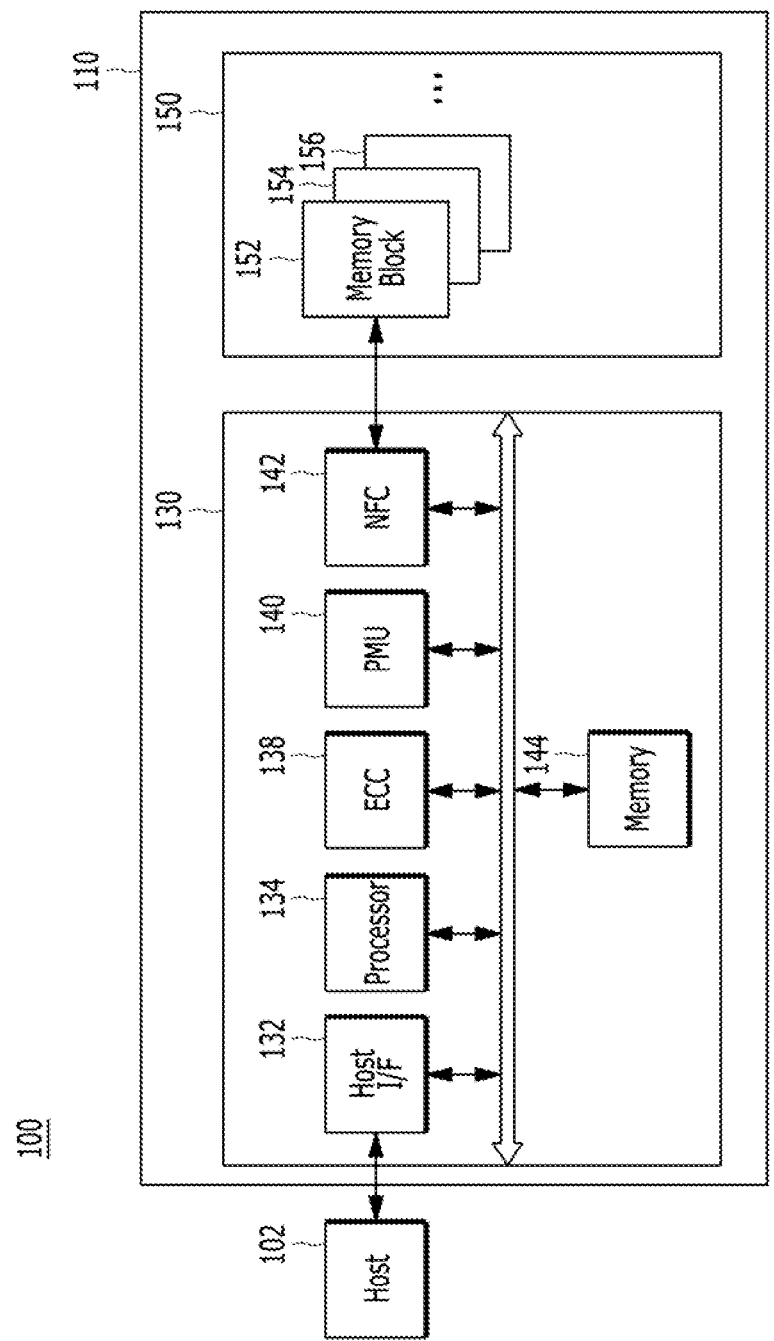
FIG. 1 is a diagram illustrating a data processing system including a memory system, according to an embodiment of the present invention.

Various embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element described in connection with one embodiment may be used singly or in combination with other elements of another embodiment, unless otherwise specifically indicated.

Hereinafter, the various embodiments of the present invention will be described in detail with reference to the attached drawings.

Referring now to FIG. 1 a data processing system including a memory system is provided, according to an embodiment of the present invention.

According to the embodiment of FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices, such as, for example, solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static random access memory (SRAM) or a nonvolatile memory device, such as, for example, a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device configured as a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device configured as a memory card, such as, for example, a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may be configured as a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) is electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols, such as, for example, universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices needed for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 the memory device 150. When the controller 130 controls the operations of the memory device 150, the memory 144 may store data used by the controller 130 and the memory device 150 for such operations as read, write, program and erase operations.

The memory 144 may be implemented with a volatile memory. The memory 144 may, for example, be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
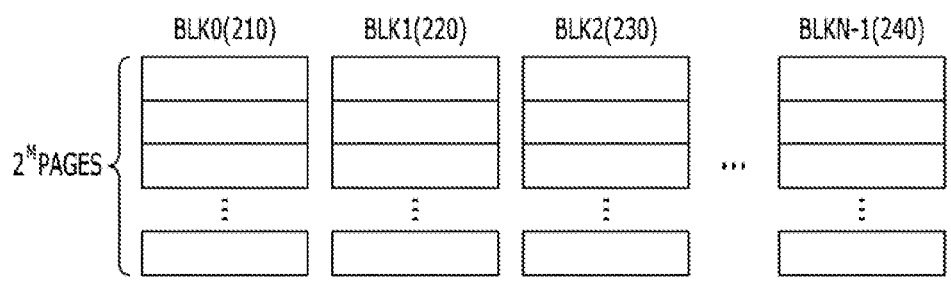
FIG. 2 is a diagram illustrating a memory device employed in the memory system of FIG. 1, according to an embodiment of the present invention.

FIG. 2 is a schematic diagram illustrating the memory device 150 shown in FIG. 1. According to the embodiment of FIG. 2, the memory device 150 may include a plurality of memory blocks, for example, zeroth to (N-1)$^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines is electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
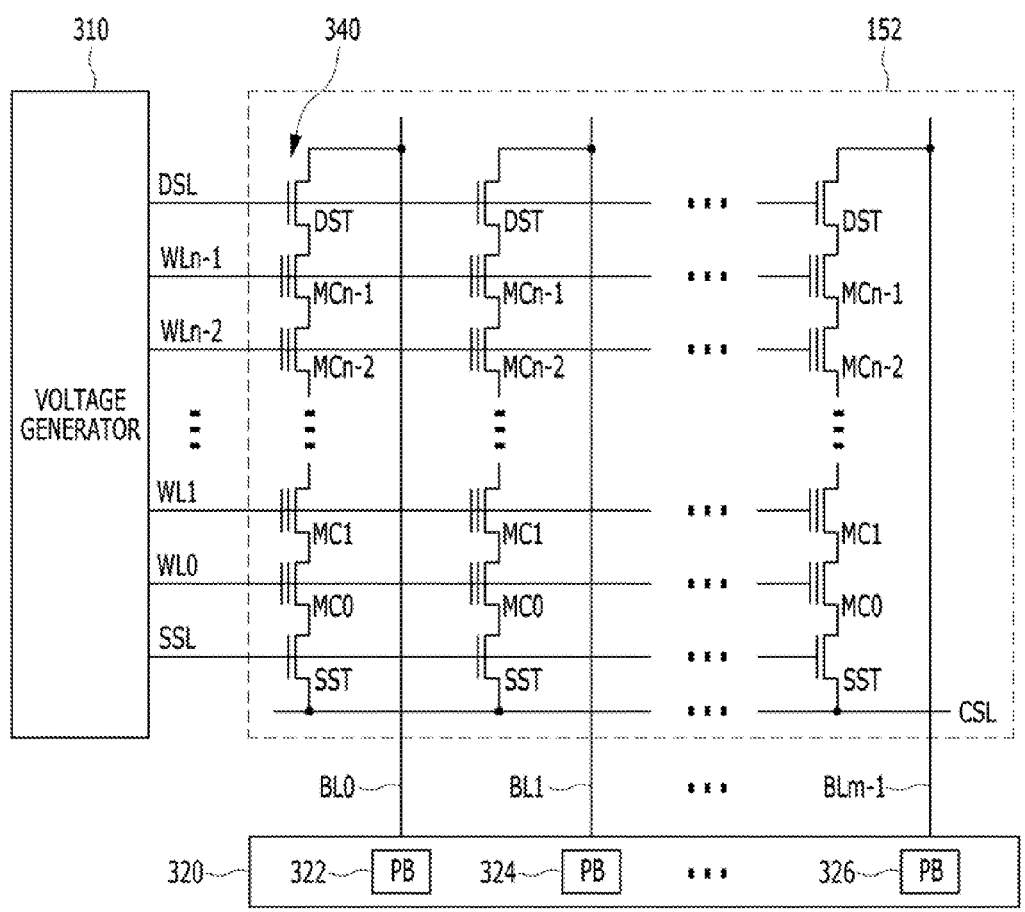
FIG. 3 is a circuit diagram illustrating a memory block in the memory device of FIG. 2, according to an embodiment of the present invention.

FIG. 3 is a circuit diagram illustrating one of the plurality of memory blocks 152 to 156 shown in FIG. 1. According to the embodiment of FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

Figure 4:
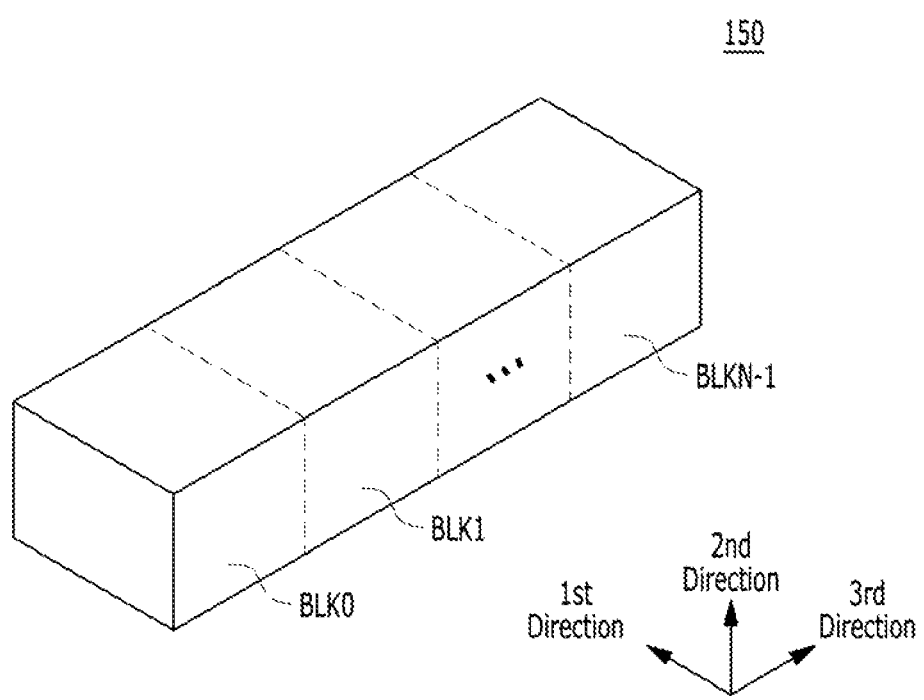
FIGS. 4 to 11 are diagrams schematically illustrating the memory device shown in FIG. 2, according to an embodiment of the present invention.

FIGS. 4 to 11 are schematic diagrams illustrating the memory device 150 shown in FIG. 1. FIG. 4 is a block diagram illustrating an example of the plurality of memory blocks 152 to 156 of the memory device 150 shown in FIG. 1.

According to the embodiment of FIG. 4, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction, a y-axis direction and a z-axis direction.

The respective memory blocks BLK0 to BLKN-1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN-1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
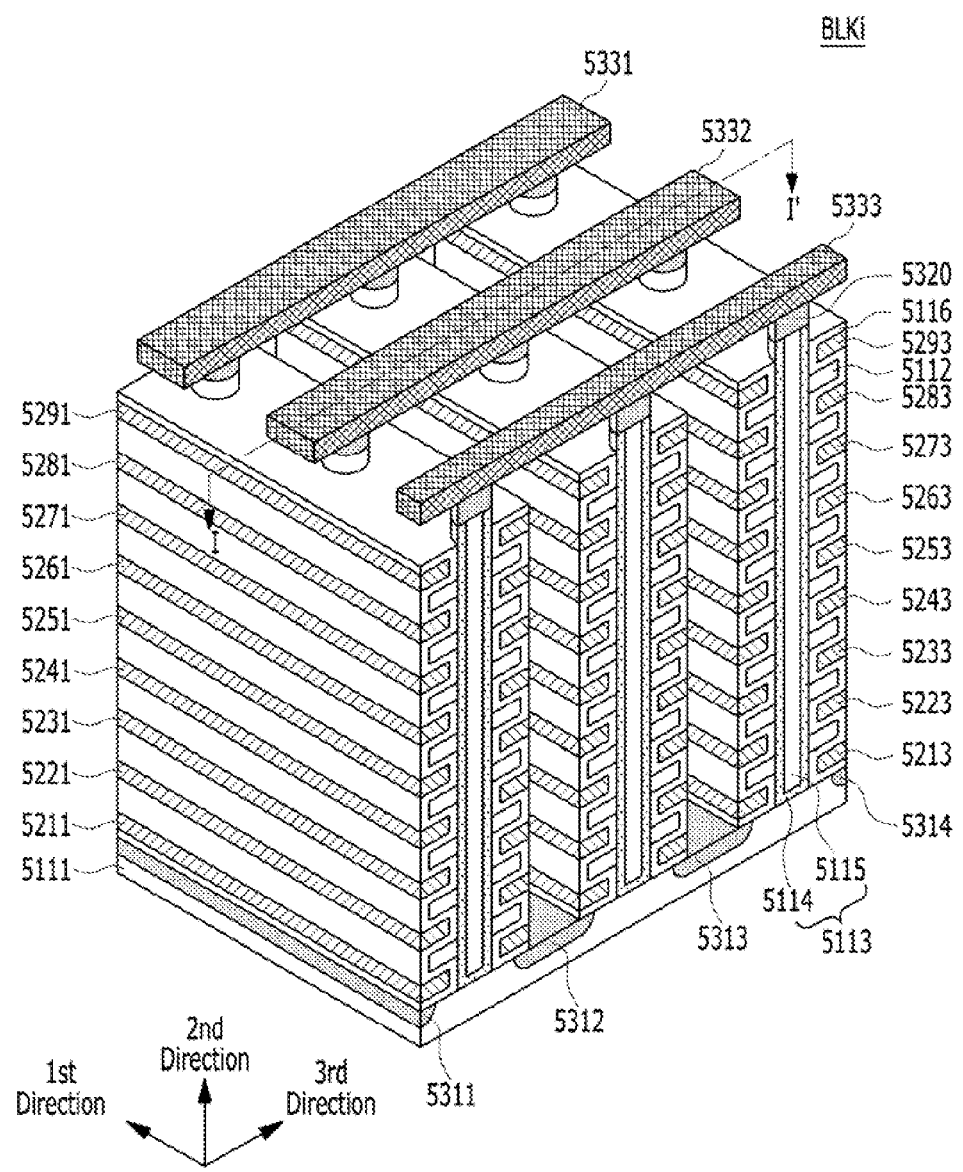
Figure 6:
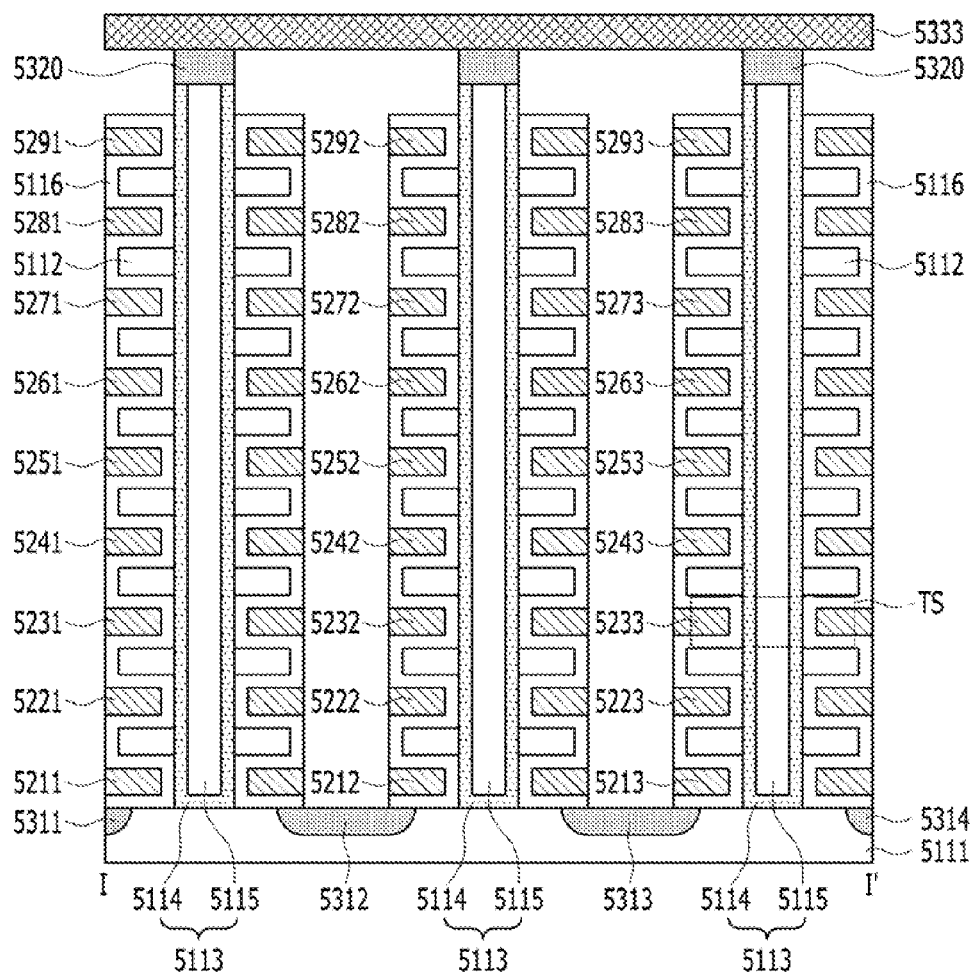

FIG. 5 is a perspective view of one BLKi of the plural memory blocks BLK0 to BLKN-1 shown in FIG. 4. FIG. 6 is a cross-sectional view taken along a line I-I' of the memory block BLKi shown in FIG. 5. According to the embodiment of FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction nay be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
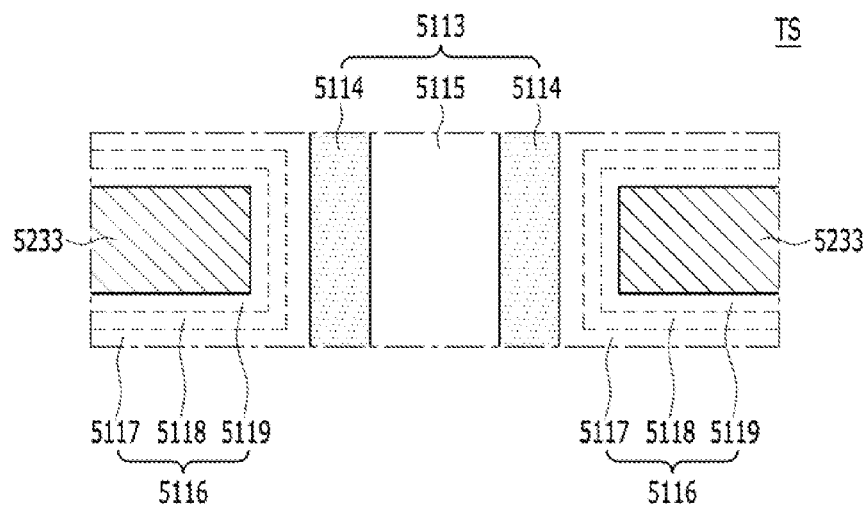

FIG. 7 is a cross-sectional view of the transistor structure TS shown in FIG. 6. According to the embodiment of FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
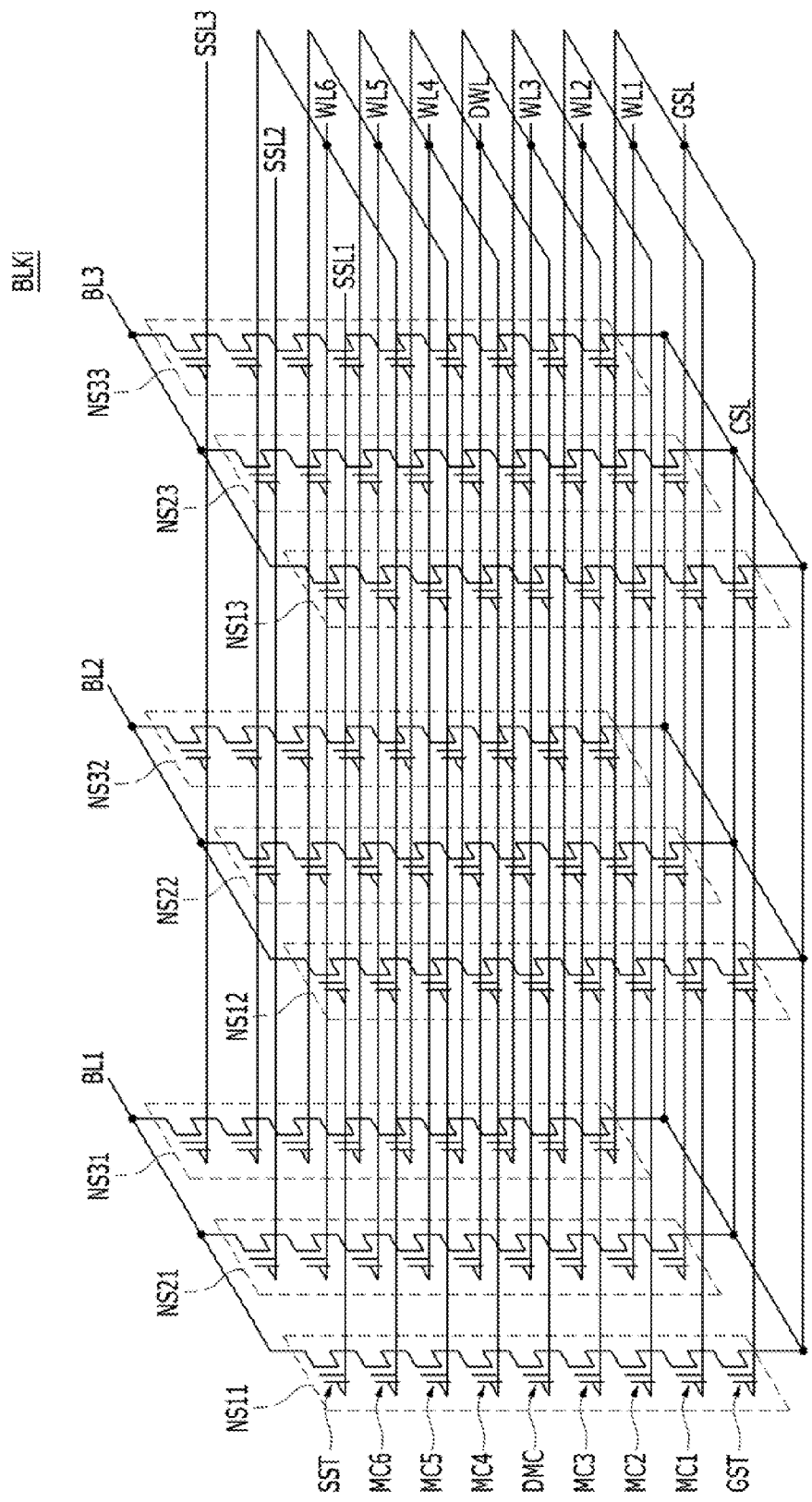

FIG. 8 is an equivalent circuit diagram illustrating the memory block BLKi having a first structure described with reference to FIGS. 5 to 7. According to the embodiment of FIG. 8, in a block BLKi having the first structure, NAND strings NS11 to NS31 may be provided between a first bit line BL1 and a common source line CSL.

The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL.

A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

Namely, as shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system according to an embodiment implemented with a three-dimensional (3D) nonvolatile memory device different from the first structure.

Figure 9:
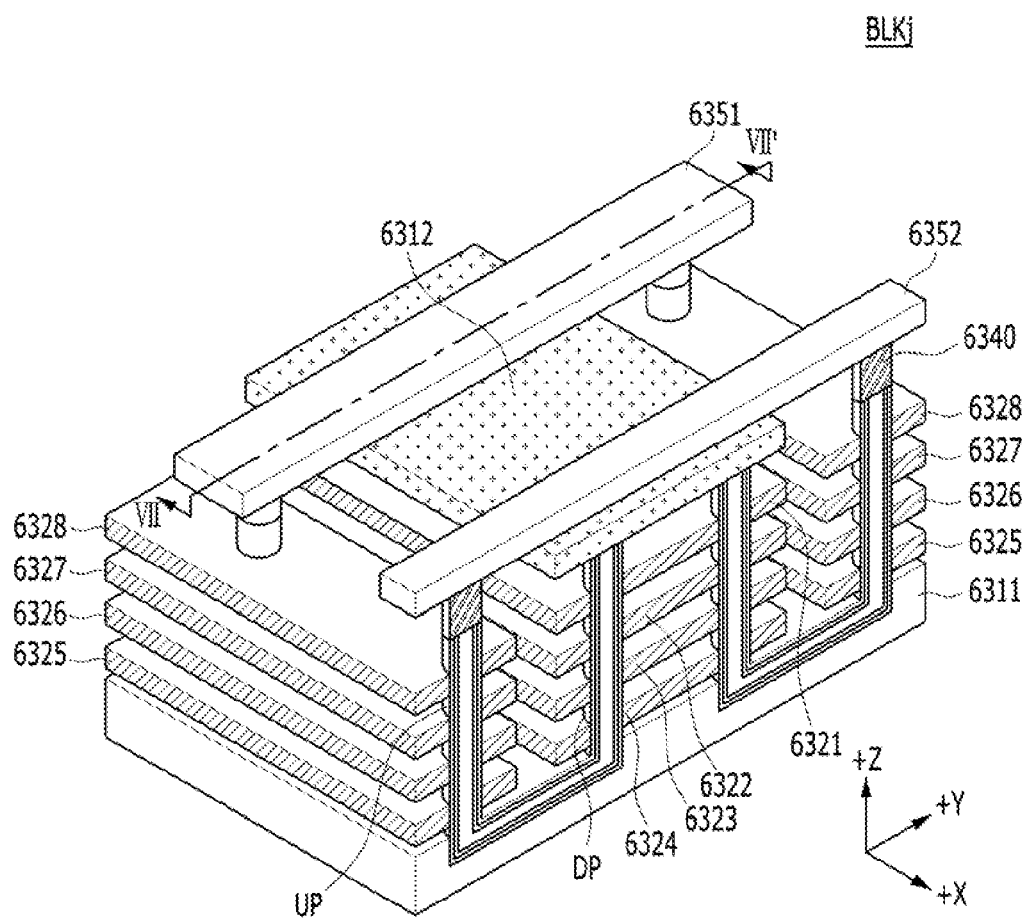

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
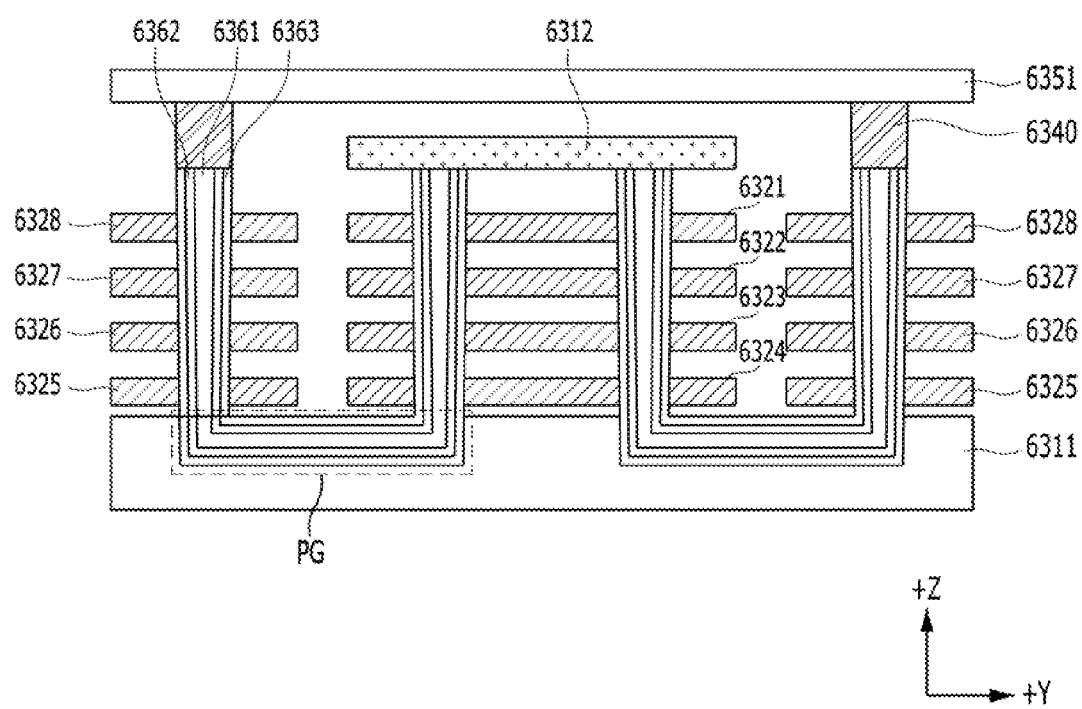

According to the embodiment of FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference FIG. 7, a detailed description thereof will be omitted herein.

Figure 11:
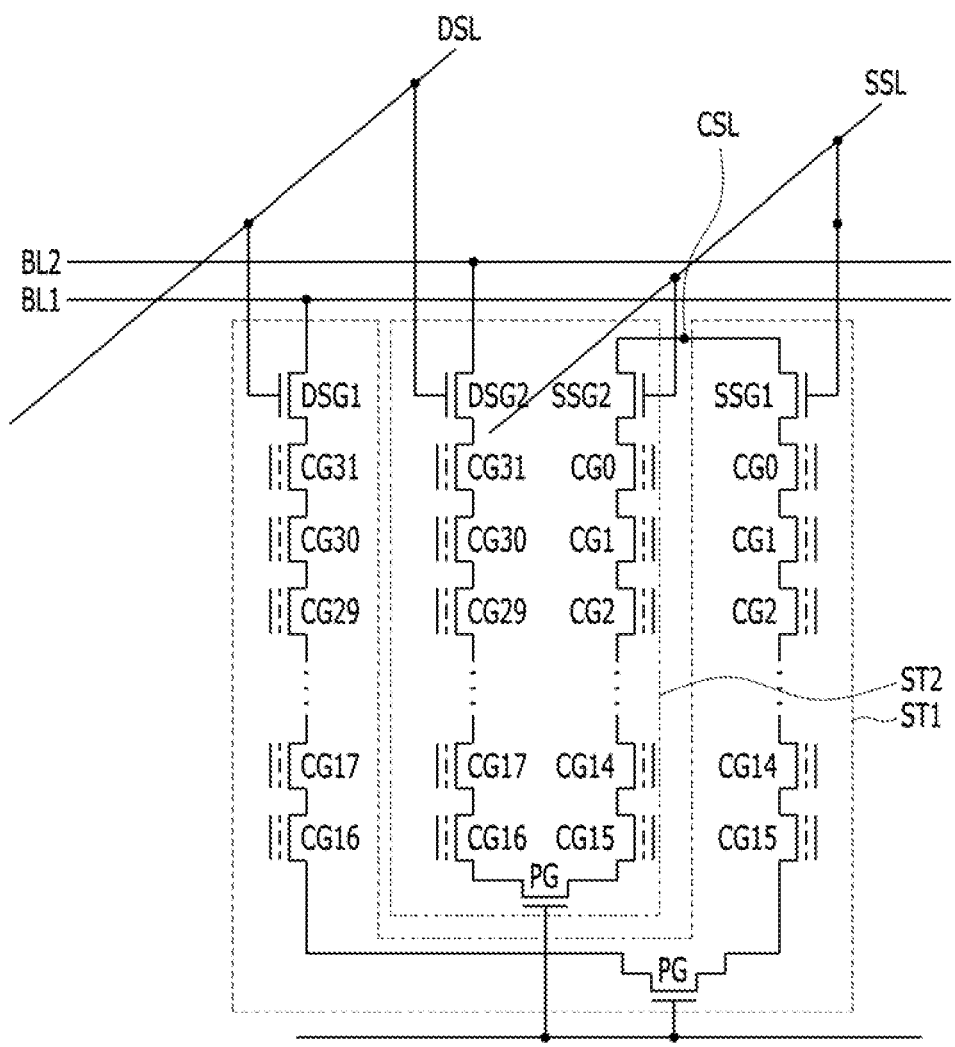

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure, are shown.

According to the embodiment of FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Figure 12:
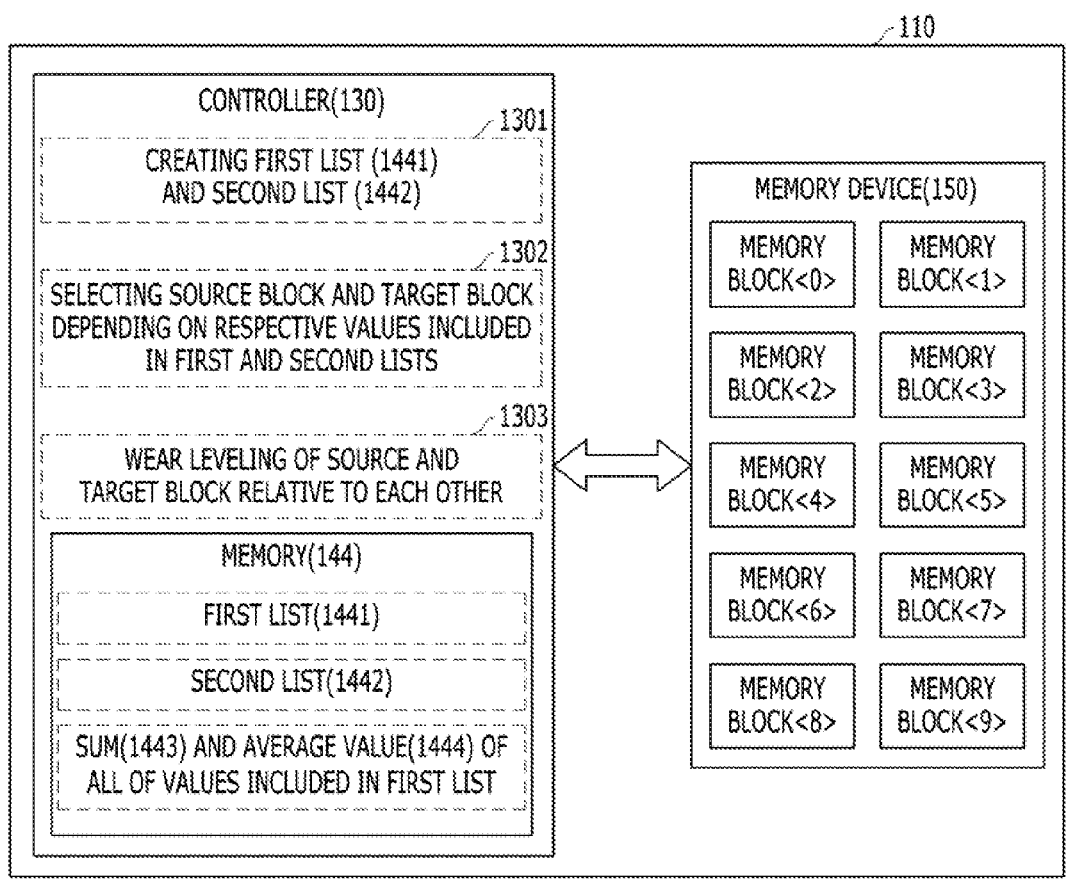
FIG. 12 is a diagram for describing a wear leveling operation which is performed in a memory system in accordance with an embodiment.

FIG. 12 is a diagram for describing wear leveling operation performed in a memory system in accordance with an embodiment. Referring to FIG. 12 and the memory system 110 shown in FIG. 1, the memory system 110 may include a memory device 150 and a controller 130.

The memory device 150 is a component corresponding to the memory device 150 described above with reference to FIG. 1. The memory device 150 includes a plurality of memory blocks MEMORY BLOCK<0:9>.

For reference, while the drawing illustrates a configuration in which ten memory blocks MEMORY BLOCK<0:9> are included in the memory device 150, this is for illustration purposes only, and it is to be noted that any number of memory blocks MEMORY BLOCK rather than 10 may be actually included in the memory device 150. Furthermore, while the drawing illustrates a configuration in which only one memory device 150 is included in the memory system 110, this is for illustration purposes only, and it is to be noted that any number of memory devices may be actually included in the memory system 110.

The controller 130 is a component corresponding to the controller 130 described above with reference to FIG. 1. A memory 144 is included in the controller 130.

The components such as the host I/F unit 132, the processor 134, the ECC unit 138, the PMU 140, and the NFC 142, are included in the controller 130 shown in FIG. 1 but not illustrated in FIG. 12. These components are only omitted or convenience of description.

The controller 130 generates a first list 1441 and a second list 1442 and stores them in the memory 144 (see 1301). Further, the controller 130 generates a sum 1443 of all values included in the first list 1441 and an average value 1444 as a quotient obtained by dividing the sum 1443 by the number of memory blocks MEMORY BLOCK<0:9>, and stores the sum 1443 and the average value 1444 in the memory 144. The first list 1441 includes respective erase count values for the plurality of memory blocks MEMORY BLOCK<0:9>. For example, referring to FIG. 13A, among the plurality of memory blocks MEMORY BLOCK<0:9>, a zeroth memory block MEMORY BLOCK<0> has '100' as an erase count value. This means that an erase operation for the zeroth memory block MEMORY BLOCK<0> has been repeatedly performed one hundred times. A first memory block MEMORY BLOCK<1> has '78' as an erase count value. This means that an erase operation for the first memory block MEMORY BLOCK<1> has been repeatedly performed seventy eight times. A second memory block MEMORY BLOCK<2> has '78' as an erase count value. This means that an erase operation for the second memory block MEMORY BLOCK<2> has been repeatedly performed seventy eight times. A third memory block MEMORY BLOCK<3> has '80' as an erase count value. This means that an erase operation for the third memory block MEMORY BLOCK<3> has been repeatedly performed eighty times.

Likewise, a fourth memory block MEMORY BLOCK<4> has '80' as an erase count value. This means that an erase operation for the fourth memory block MEMORY BLOCK<4> has been repeatedly performed eighty times. A fifth memory block MEMORY BLOCK<5> has '0' as an erase count value. This means that an erase operation for the fifth memory block MEMORY BLOCK<5> has never been performed before. A sixth memory block MEMORY BLOCK<6> has '2' as an erase count value. This means that an erase operation for the sixth memory block MEMORY BLOCK<6> has been repeatedly performed two times.

Likewise, a seventh memory block MEMORY BLOCK<7> has '2' as an erase count value. This means that an erase operation for the seventh memory block MEMORY BLOCK<7> has been repeatedly performed two times. An eighth memory block MEMORY BLOCK<8> has '100' as an erase count value. This means that an erase operation for the eighth memory block MEMORY BLOCK<8> has been repeatedly performed one hundred times. A ninth memory block MEMORY BLOCK<9> has '80' as an erase count value. This means that an erase operation for the ninth memory block MEMORY BLOCK<9> has been repeatedly performed eighty times.

In this way, the respective erase count values, e.g., '100, 78, 78, 80, 80, 0, 2, 2, 100, 80', for the plurality of memory blocks MEMORY BLOCK<0:9> are included in the first list 1441.

That is, it is to be understood that the values included in the first list 1441 are listed in a form corresponding to the number of memory blocks MEMORY BLOCK<0:9> included in the memory device 150. Therefore, each time when an erase operation for each of the plurality of memory blocks MEMORY BLOCK<0:9> is performed, the controller 130 updates associated values included in the 1441. Furthermore, when updating the respective values included in the first list 1441, the controller 130 also updates the sum 1443 of all of the values. In addition, when updating the respective values included in the first list 1441, the controller 130 also updates the average value 1444 that is the quotient obtained by dividing the sum 1443 of all of the values included in the first list 1441 by the number of memory blocks MEMORY BLOCK<0:9>.

The second list 1442 shows 'difference values' between 'the average value 1444 of all of the values included in the first list 1441' and 'the respective values included in the first list 1441'.

For example, when '100, 78, 78, 80, 80, 0, 2, 2, 100, 80' are included in the first list 1441, the sum 1443 of all of the values included in the first list 1441 is '600', and the average value 1444 is '60' since the quotient of '600' is divided by '10' which is the number of memory blocks MEMORY BLOCK<0:9> is '60'.

The results of calculating the difference values between the average value of all of the values included in the first list 1441 and the respective values included in the first list 1441 are '−40, −18, −18, −20, −20, 60, 58, 58, −40, −20'. However, such a calculation result is not included in the second list 1442 as is.

The reason for this is that the second list 1442 is for the wear leveling operation. That is, the values included in the second list 1442 are updated during the wear leveling operation for better efficiency.

Therefore, the controller 130 sets respective values included in the second list 1442 to predetermined initial values. Thereafter, when a target block is selected among the plurality of memory blocks MEMORY BLOCK<0:9> the controller 130 updates a value only for the selected target block.

The controller 130 selects a source block and a target block among the plurality of memory blocks MEMORY BLOCK<0:9> depending on the respective values included in the first list 1441 and the respective values included in the second list 1442 (at 1302). The controller 130 performs wear leveling of the source block and the target block selected from among the plurality of memory blocks MEMORY BLOCK<0:9> relative to each other (at 1303).

In detail, the controller 130 selects as the source block, a memory block with a maximum value among the respective values included in the first list 1441. For example, referring to FIG. 13A, the respective values included in the first list 1441 are '100, 78, 78, 80, 80, 0, 2, 2, 100, 80', and the maximum value among them is '100' included as a first turn and '100' included as a ninth turn.

The value included as the first turn in the first list 1441 is a value corresponding to the zeroth memory block MEMORY BLOCK<0> among the zeroth to ninth memory blocks MEMORY BLOCK<0:9>. The value included as the ninth turn in the first list 1441 is a value corresponding to the eighth memory block MEMORY BLOCK<8> among the zeroth to ninth memory blocks MEMORY BLOCK<0:9>. Therefore, the controller 130 selects, as the source block, either the zeroth memory block MEMORY BLOCK<0> or the eighth memory block MEMORY BLOCK<8> that has the maximum value "100' in the first list 1441. For reference, although FIG. 13A illustrates the case where the zeroth memory block MEMORY BLOCK<0> is selected as the source block, this for illustration purposes only, and it is to be noted that the eighth memory block MEMORY BLOCK<8> may be selected as the source block according to a designer's choice.

Furthermore, the controller 130 selects as the source block, any one memory block that is in a free block state among memory blocks corresponding to the maximum value of the respective values included in the first list 1441. The reason for this is that the operation 1303 of performing the wear leveling of the source block and the target block relative to each other may be simplified by transferring data stored in a memory block selected as the target block to the source block. That is, when the memory block selected as the source block is in a free block state, the operation 1303 of performing the wear leveling of the source block and the target block relative to each other may be realized merely by copying data stored in the memory block selected as the target block into the source block and erasing the data from the target block. In this way, the wear leveling operation may be simplified.

In another embodiment, the controller 130 may select as the source block, any one memory block that is not in a free block state among memory blocks corresponding to the maximum value of the respective values included in the first list 1441. However, when the memory block that is not in the free block state is selected as the source block and used in the wear leveling operation, data stored in the memory block selected as the source block and data stored in the memory block selected as the target block are swapped with each other, and thus the wear leveling operation may be complicated.

The controller 130 selects, as the target block, a memory block that corresponds to, among the respective values included in the second list 1442, a value less than 'a difference value' between 'the average value 1444 of all of the values included in the first list 1441' and 'an associated one of the respective values included in the first list 1441' and, simultaneously, corresponds to 'a relatively smallest value among the values included in the first list 1441'.

In this regard, the operation of selecting the target block among the plurality of memory blocks MEMORY BLOCK<0:9> should check two conditions. The first condition is that the value of the second list 1442 that corresponds to the target block is less than 'the difference value' between 'the average value 1444 of all of the values included in the first list 1441' and 'an associated value of the respective values included in the first list 1441'. The second condition is that the value in the first list 1441 that corresponds to the target block is 'a relatively smallest value' among the respective values included in the first list 1441.

Therefore, the operation of selecting the target block among the plurality of memory blocks MEMORY BLOCK<0:9> may include a first operation of selecting a memory block which meets the first condition and then checking whether the selected memory block meets the second condition. In another embodiment, the operation of selecting the target block nay include a second operation of selecting a memory block which meets the second conditions and then checking whether the selected memory block meets the first condition.

The first operation of selecting the target block among the plurality of memory blocks MEMORY BLOCK<0:9> is performed in the following sequence. First, among the respective values included in the second list 1442, values that are less than 'difference values' between 'the average value 1444 of all of the values included in the first list 1441' and 'the respective values included in the first list 1441' are selected.

Values in the first list 1441 that correspond to the respective values selected from the second list 1442 are determined, and then a memory block that corresponds to a relatively smallest value among the determined values is selected as the target block.

The second operation of selecting the target block among the plurality of memory blocks MEMORY BLOCK<0:9> is performed in the following sequence. First, each of the values included in the first list 1441 is selected as 'a target value' one by one in a sequence in which the selected value sequentially increases from the minimum value.

When a value in the second list 1442 that corresponds to 'the target value' of the first list 1441 selected in the above-mentioned manner is equal to or larger than 'a difference value' between 'the average value 1444 of all of the values included in the first list 1441' and 'an associated one of the values included in the first list 1441', 'the selected target value' of the first list 1441 is ignored, and a subsequent 'target value' is selected from the first list 1441.

Furthermore, when the value in the second list 1442 that corresponds to 'the target value' of the first list 1441 is less than 'the difference value' between 'the average value 1444 of all of the values included in the first list 1441' and 'the associated one of the values included in the first list 1441', a memory block corresponding to 'the selected target value' of the first list 1441 is selected as the target block.

The reason why the first condition of the two conditions of the operation of selecting the target block among the plurality of memory blocks MEMORY BLOCK<0:9> is required, in other words, why the condition of finding a value in the second list 1442 that is less than 'a difference value' between 'the average value 1444 of all of the values included in the first list 1441' and 'an associated one of the respective values included in the first list 1441' is required, is to prevent the same memory block from being selected twice as the target block during consecutive wear leveling operations since an erase count value of the certain one memory block is excessively small.

As described above, in the second list 1442, 'the difference values' between 'the average value 1444 of all of the values included in the first list 1441' and 'the respective values included in the first list 1441' are included in a form of a list. Furthermore, with regard to the respective values included in the second list 1442, the only case where a value in the second list 1442 is actually updated as 'a difference value' between 'the average value 1444 of all of the values included in the first list 1441' and 'an associated one of the values included in the first list 1441' is when the corresponding memory block is selected as the target block for the wear leveling operation. That is, only for a memory block selected as the target block for the wear leveling operation, 'a difference value' is updated as a value in the second list 1442 that corresponds to the memory block. Therefore, values in the second list 1422 that correspond to memory blocks that have never been selected as the target block for the wear leveling operation remain with initial values.

In this state, when a value in the second list 1442 that becomes a comparison target to 'the difference value' between 'the average value 1444 of all of the values included in the first list 1441' and 'the associated one of the respective values included in the first list 1441' has an initial value, it means that the memory block corresponding to the value in the second list 1442 that becomes the comparison target has never been selected as the target block. Therefore, it is determined that the first condition is definitely satisfied.

However, when a value in the second list 1442 that becomes a comparison target to 'the difference value' between 'the average value 1444 of all of the values included in the first list 1441' and 'the associated one of the respective values included in the first list 1441' has 'an arbitrary value,' it means that the memory block corresponding to the value in the second list 1442 that becomes the comparison target has been selected as the target block.

The 'arbitrary value', which is the value in the second list 1442 that becomes the comparison target, is 'the difference value' between 'the average value 1444 of all of the values included in the first list 1441' and 'the associated one of the respective values in the first list 1441' that has been used in a former wear leveling operation that has been completed in the past.

Moreover, 'the average value 1444 of all of the values included in the first list 1441' can only be increased but cannot be reduced over time. Therefore, when sufficient time has passed after the former wear leveling operation has been completed, it is to be understood that 'the difference value' between 'the average value 1444 of all of the values included in the first list 1441' and 'the associated one of the respective values in the first list 1441' becomes greater than 'the arbitrary value', which is the value in the second list 1442. Here, the phrase "sufficient has passed after the former wear leveling operation has been completed" refers to that enough time has passed for 'the average value 1444 of all of the values included in the first list 1441' to be increased to a certain degree.

However, when sufficient time has not passed after the former wear leveling operation has been completed, 'the difference value' between 'the average value 1444 of all of the values included in the first list 1441' and 'the associated one of the respective values in the first list 1441' is equal to or less than 'the arbitrary value', which is a value in the second list 1442. Here, the phrase "sufficient time has not passed after the former wear leveling operation has been completed" means that such time has passed that 'the average value 1444 of all of the values included in the first list 1441' cannot be increased or is increased slightly.

Accordingly, when the first condition applies to select the target block among the plurality of memory blocks MEMORY BLOCK<0:9>, it is possible to prevent the same memory block from being selected as the target block in consecutive wear leveling operations.

FIGS. 13A to 13C are diagram for describing an example of the wear leveling operation performed in the memory system in accordance with the embodiment shown in FIG. 12. FIG. 13A, describes a state before a first wear leveling operation is performed and after the controller 130 that is one of the components of the memory system 110 in accordance with the embodiment shown in FIG. 12 generates the first list 1441 and the second list 1442 for the plurality of memory blocks MEMORY BLOCK<0:9> included in the memory device 150.

In detail, among the plurality of memory blocks MEMORY BLOCK<0:9>, the zeroth memory block MEMORY BLOCK<0> has '100' as an erase count value included in the first list 1441. The zeroth memory block MEMORY BLOCK<0> has a predetermined initial value INIT as a value included in the second list 1442 since it has never been selected as the target block during the wear leveling operation. Furthermore, the zeroth memory block MEMORY BLOCK<0> is in a free block state FREE in which no data is stored therein.

Among the plurality of memory blocks MEMORY BLOCK<0:9>, the first memory block MEMORY BLOCK<1> has '78' as an erase count value included in the first list 1441. The first memory block MEMORY BLOCK<1> has a predetermined initial value INIT as a value included in the second list 1442 since it has never been selected as the target block during the wear leveling operation. Furthermore, the first memory block MEMORY BLOCK<1> is in a state in which normal data NORMAL DATA is stored therein.

Among the plurality of memory blocks MEMORY BLOCK<0:9>, the second memory block MEMORY BLOCK<2> has '78' as an erase count value included in the first list 1441. The second memory block MEMORY BLOCK<2> has a predetermined initial value INIT as a value included in the second list 1442 since it has never been selected as the target block during the wear leveling operation. Furthermore, the second memory block MEMORY BLOCK<2> is in a state in which normal data NORMAL DATA is stored therein.

Among the plurality of memory blocks MEMORY BLOCK<0:9>, the third memory block MEMORY BLOCK<3> has '80' as an erase count value included in the first list 1441. The third memory block MEMORY BLOCK<3> has a predetermined initial value INIT as a value included in the second list 1442 since it has never been selected as the target block during the wear leveling operation. Furthermore, the third memory block MEMORY BLOCK<3> is in a state in which normal data NORMAL DATA is stored therein.

Among the plurality of memory blocks MEMORY BLOCK<0:9>, the fourth memory block MEMORY BLOCK<4> has '80' as an erase count value included in the first list 1441. The fourth memory block MEMORY BLOCK<4> has a predetermined initial value INIT as a value included in the second list 1442 since it has never been selected as the target block during the wear leveling operation. Furthermore, the fourth memory block MEMORY BLOCK<4> is in a state in which normal data NORMAL DATA is stored therein.

Among the plurality of memory blocks MEMORY BLOCK<0:9>, the fifth memory block MEMORY BLOCK<5> has '0' as an erase count value included in the first list 1441. The fifth memory block MEMORY BLOCK<5> has a predetermined initial value INIT as a value included in the second list 1442 since it has never been selected as the target block during the wear leveling operation. Furthermore, the fifth memory block MEMORY BLOCK<5> is in a state in which cold data COLD DATA is stored therein.

Among the plurality of memory blocks MEMORY BLOCK<0:9>, the sixth memory block MEMORY BLOCK<6> has '2' as an erase count value included in the first list 1441. The sixth memory block MEMORY BLOCK<6> has a predetermined initial value INIT as a value included in the second list 1442 since it has never been selected as the target block during the wear leveling operation. Furthermore, the sixth memory block MEMORY BLOCK<6> is in a state in which cold data COLD DATA is stored therein.

Among the plurality of memory blocks MEMORY BLOCK<0:9>, the seventh memory block MEMORY BLOCK<7> has '2' as an erase count value included in the first list 1441. The seventh memory block MEMORY BLOCK<7> has a predetermined initial value INIT as a value included in the second list 1442 since it has never been selected as the target block during the wear leveling operation. Furthermore, the seventh memory block MEMORY BLOCK<7> is in a state in which cold data COLD DATA is stored therein.

Among the plurality of memory blocks MEMORY BLOCK<0:9>, the eighth memory block MEMORY BLOCK<8> has '100' as an erase count value included in the first list 1441. The eighth memory block MEMORY BLOCK<8> has a predetermined initial value INIT as a value included in the second list 1442 since it has never been selected as the target block during the wear leveling operation. Furthermore, the eighth memory block MEMORY BLOCK<8> is in a free block state FREE in which no data is stored therein.

Among the plurality of memory blocks MEMORY BLOCK<0:9>, the ninth memory block MEMORY BLOCK<9> has '80' as an erase count value included in the first list 1441. The ninth memory block MEMORY BLOCK<9> has a predetermined initial value INIT as a value included in the second list 1442 since it has never been selected as the target block during the wear leveling operation. Furthermore, the ninth memory block MEMORY BLOCK<9> is in a state in which normal data NORMAL DATA is stored therein.

In this state, the controller 130 selects, as the source block, a memory block having the maximum value among the respective values included in the first list 1441. For example, the respective values included in the first list 1441 are '100, 78, 78, 80, 80, 0, 2, 2, 100, 80', and the maximum value among them is '100' included as a first turn and '100' included as a ninth turn. The value included as the first turn in the first list 1441 is a value corresponding to the zeroth memory block MEMORY BLOCK<0> among the zeroth to ninth memory blocks MEMORY BLOCK<0:9>. The value included as the ninth turn in the first list 1441 is a value corresponding to the eighth memory block MEMORY BLOCK<8> among the zeroth to ninth memory blocks MEMORY BLOCK<0:9>.

Therefore, the controller 130 selects, as the source block, either the zeroth memory block MEMORY BLOCK<0> or the eighth memory block MEMORY BLOCK<8> that corresponds to '100' that is the maximum value of the values included in the first list 1441. Although, in FIG. 13A, the zeroth memory block MEMORY BLOCK<0> is selected as the source block, this is for illustration purposes only, and it is to be noted that the eighth memory block MEMORY BLOCK<8> may be selected as the source block according to a designer's choice.

The controller 130 selects, as the target block, a memory block that satisfies both the first condition that a value in the second list 1442 is less than 'a difference value' between 'the average value 1444 of all of the values included in the first list 1441' and 'an associated one of the respective values included in the first list 1441', and the second condition that the target block corresponds to 'a relatively smallest value' among the respective values included in the first list 1441.

The controller 130 selects one of the plurality of memory blocks MEMORY BLOCK<0:9> as the target block according to the first operation of selecting a memory block that meets the first condition and then selecting a memory block that meets the second condition. The target block selecting operation is performed as follows.

First, among the respective values included in the second list 1442, values that are less than 'difference values' between 'the average value 1444 of all of the values included in the first list 1441' and 'the respective values included in the first list 1441' are selected.

With regard to the values included in the second list 1442, all of the values included in the second list 1442 are the predetermined initial values INIT. That is, all of the values in the second list 1442 that correspond to the respective memory blocks MEMORY BLOCK<0:9> are the predetermined initial values INIT. Thus, every memory block MEMORY BLOCK<0:9> has never been selected as the target block during the wear leveling operation.

Therefore, in the operation of checking whether each of the plurality of memory blocks MEMORY BLOCK<0:9> satisfies the first condition to determine the target block, every memory block is definitely in a satisfied state. That is, a certain memory block is not selected according to the first condition.

Subsequently, values in the first list 1441 that correspond to the respective values selected from the second list 1442 are determined, and a memory block that corresponds to a relatively smallest value among the determined values is selected as the target block.

As described above, since all of the plurality of memory blocks MEMORY BLOCK<0:9> satisfy the first condition, whether the second condition is satisfied is then checked for all of the plurality of memory blocks MEMORY BLOCK<0:9>.

In detail, among the respective values included in the first list 1441 are '100, 78, 78, 80, 80, 0, 2, 2, 100, 80', the smallest value among them, that is, the minimum value, is '0' included as a sixth turn. The value included as the sixth turn in the first list 1441 is a value corresponding to the fifth memory block MEMORY BLOCK<5> among the zeroth to ninth memory blocks MEMORY BLOCK<0:9>. Therefore, the controller 130 selects, as the target block, the fifth memory block MEMORY BLOCK<5> that corresponds to '0' that is the minimum value of the values included in the first list 1441.

In the case in which the controller 130 selects one of the plurality of memory blocks MEMORY BLOCK<0:9> as the target block according to a second operation of selecting a memory block that meets the second condition and then selecting a memory block that meets the first condition, the target block selecting operation is performed as follows.

First, each of the values included in the first list 1441 is selected as 'a target value' one by one in a sequence in which the selected value sequentially increases from the minimum value.

In the case in which a value in the second list 1442 that corresponds to 'a target value' of the first list 1441 selected in the above-mentioned manner is equal to or larger than 'a difference value' between 'the average value 1444 of all of the values included in the first list 1441' and 'an associated one of the respective values included in the first list 1441', 'the selected target value' of the first list 1441 is ignored, and a subsequent 'target value' is selected from the first list 1441.

However, in the case in which the value in the second list 1442 that corresponds to 'the target value' of the first list 1441 is less than 'the difference value' between 'the average value 1444 of all of the values included in the first list 1441' and 'the associated one of the values included in the first list 1441', the memory block corresponding to 'the selected target value' of the first list 1441 is selected as the target block.

In detail, among the respective values included in the first list 1441 are '100, 78, 78, 80, 80, 0, 2, 2, 100, 80', the relatively smallest value among them, that is, the minimum value, is '0' included as a sixth turn. Since, among the respective values included in the second list 1442, the value included as the sixth turn is verified as being the predetermined initial value INIT, this satisfies the first condition. Therefore, the memory block that corresponds to the value included as the sixth turn in each of the first and second lists 1441 and 1442, that is, the fifth memory block MEMORY BLOCK<5> among the plurality of memory blocks MEMORY BLOCK<0:9>, is selected as the target block.

In this regard, '100, 78, 78, 80, 80, 0, 2, 2, 100, 80' are included in the first list 1441. Therefore, the sum 1443 of all of the values included in the first list 1441 is '600', and the average value 1444 that is the quotient of '600' divided by '10' which is the number of memory blocks MEMORY BLOCK<0:9> is '60'.

Referring to FIG. 13B, the first list 1441 and the second list 1442 have changed when a first wear leveling operation in accordance with a first embodiment is performed in the state of FIG. 13A described above.

In detail, the zeroth memory block MEMORY BLOCK<0> that has been selected as the source block in FIG. 13A has '100' as an erase count value included in the first list 1441. That is, since existing data that has been stored in the fifth memory block MEMORY BLOCK<5> is merely copied into the zeroth memory block MEMORY BLOCK<0> while the first wear leveling operation is performed, there is no change in the erase count value of the zeroth memory block MEMORY BLOCK<0> that is included in the first list 1441.

Furthermore, since the zeroth memory block MEMORY BLOCK<0> has been selected as only the source block but never been selected as the target block during the first wear leveling operation, the zeroth memory block MEMORY BLOCK<0> has the predetermined initial value INIT as a value included in the second list 1442 in the same manner as in FIG. 13A.

Furthermore, the zeroth memory block MEMORY BLOCK<0> is in a state in which cold data COLD DATA is stored therein. That is, while the first wear leveling operation is performed, since the existing cold data COLD DATA that has been stored in the fifth memory block MEMORY BLOCK<5> is copied into the zeroth memory block MEMORY BLOCK<0>, the zeroth memory block MEMORY BLOCK<0> has cold data COLD DATA therein.

The fifth memory block MEMORY BLOCK<5> has '1' as an erase count value included in the first list 1441. That is, since the existing data that has been stored in the fifth memory block MEMORY BLOCK<5> is erased while the first wear leveling operation is performed, the erase count value of the fifth memory block MEMORY BLOCK<5> that is included in the first list 1441 is '0' in FIG. 13A before the first wear leveling operation is performed and becomes '1' in FIG. 13B after the first wear leveling operation is performed.

The fifth memory block MEMORY BLOCK<5> is a block selected as the target block during the first wear leveling operation. The 'difference values' between 'the average value 1444 of all of the values included in the first list 1441' and 'the respective values included in the first list 1441' are included in the second list 1442.

In this regard, the value of the second list 1442 for the fifth memory block MEMORY BLOCK<5> shown in FIG. 13B is a value that is in the same state as that of FIG. 13A, that is, a value that is determined before the first wear leveling operation is performed and after the zeroth memory block MEMORY BLOCK<0> is selected as the source block and the fifth memory block MEMORY BLOCK<5> is selected as the target block.

At a time when the erase count value for the fifth memory block MEMORY BLOCK<5> that is included in the first list 1441 is '0', 'a difference value' between it and 'the average value 1444 of all of the values included in the first list 1441' is included as the value of the second list 1442 for the fifth memory block MEMORY BLOCK<5>. In this regard, since 'the average value 1444 of all of the values included in the first list 1441' is '60' and the erase count value in the first list of the fifth memory block MEMORY BLOCK<5> before the first wear leveling operation is '0', 'a difference value' between them is 60. Thus, the value of the second list 1442 for the fifth memory block MEMORY BLOCK<5> becomes '60'.

Furthermore, the fifth memory block MEMORY BLOCK<5> is in a free block state FREE in which no data is stored therein. That is, while the first wear leveling operation is performed, since the existing cold data COLD DATA that has been stored in the fifth memory block MEMORY BLOCK<5> is copied into the zeroth memory block MEMORY BLOCK<0> and the data of the fifth memory block MEMORY BLOCK<5> is erased, the fifth memory block MEMORY BLOCK<5> is in the free block state in which no data is stored therein.

Among the plurality of memory blocks MEMORY BLOCK<0:9>, the states of blocks that are selected neither as the source block nor as the target block, that is, the first to fourth memory blocks MEMORY BLOCK<1:4> and the sixth to ninth memory blocks MEMORY BLOCK<6:9>, remain in the same states as described with reference to FIG. 13A. Therefore, further description thereof will be omitted.

Referring to FIG. 13C, the first list 1441 and the second list 1442 have changed when a first wear leveling operation in accordance with a second embodiment is performed in the state of FIG. 13A described above.

In detail, the zeroth memory block MEMORY BLOCK<0> that has been selected as the source block in FIG. 13A has '100' as an erase count value included in the first list 1441. That is, since existing data that has been stored in the fifth memory block MEMORY BLOCK<5> has been merely copied into the zeroth memory block MEMORY BLOCK<0> while the first wear leveling operation is performed, there is no change in the erase count value of the zeroth memory block MEMORY BLOCK<0> that is included in the first list 1441.

Furthermore, since the zeroth memory block MEMORY BLOCK<0> has been selected as only the source block but never been selected as the target block during the first wear leveling operation, the zeroth memory block MEMORY BLOCK<0> has the predetermined initial value INIT as a value included in the second list 1442 in the same manner as in FIG. 1A.

Furthermore, the zeroth memory block MEMORY BLOCK<0> is in a state in which cold data COLD DATA is stored therein. That is, while the first wear leveling operation is performed, since the existing cold data COLD DATA that has been stored in the fifth memory block MEMORY BLOCK<5> has been copied into the zeroth memory block MEMORY BLOCK<0>, the zeroth memory block MEMORY BLOCK<0> has cold data COLD DATA therein.

The fifth memory block MEMORY BLOCK<5> has '1' as an erase count value included in the first list 1441. That is, since the existing data that has been stored in the fifth memory block MEMORY BLOCK<5> is erased while the first wear leveling operation is performed, the erase count value of the fifth memory block MEMORY BLOCK<5> '0' that is included in the first list 1441 before the first wear leveling operation is updated to '1' in FIG. 13C after the first wear leveling operation.

The fifth memory block MEMORY BLOCK<5> is a block selected as the target block during the first wear leveling operation. The 'difference values' between the average value 1444 of all of the values included in the first list 1441 and 'the respective values included in the first list 1441' are included in the second list 1442.

In the second embodiment shown in FIG. 13C, the value of the second list 1442 for the fifth memory block MEMORY BLOCK<5> shown in FIG. 13C is a value that is determined after the first wear leveling operation is performed. In contrast, in the first embodiment shown in FIG. 13B, the value of the second list 1442 for the fifth memory block MEMORY BLOCK<5> is a value that is determined before the first wear leveling operation is performed.

At a time when the erase count value for the fifth memory block MEMORY BLOCK<5> that is included in the first list 1441 is '1', 'a difference value' between it and 'the average value 1444 of all of the values included in the first list 1441' is calculated and saved as the value of the second list 1442 for the fifth memory block MEMORY BLOCK<5>. Since 'the average value 1444 of all of the values included in the first list 1441' is '60' and the erase count value in the first list of the fifth memory block MEMORY BLOCK<5> after the first wear leveling operation is '1', the value of the second list 1442 for the fifth memory block MEMORY BLOCK<5> becomes '59'.

Upon completion of the first wear leveling operation, the fifth memory block MEMORY BLOCK<5> is in a free block state FREE in which no data is stored therein. That is, while the first wear leveling operation is performed, since the existing cold data COLD DATA that has been stored in the fifth memory block MEMORY BLOCK<5> is copied into the zeroth memory block MEMORY BLOCK<0> and the data of the fifth memory block MEMORY BLOCK<5> is erased, the fifth memory block MEMORY BLOCK<5> is in the free block state in which no data is stored therein.

Among the plurality of memory blocks MEMORY BLOCK<0:9>, the state of blocks that are selected neither as the source block nor as the target block, that is, the first to fourth memory blocks MEMORY BLOCK<1:4> and the sixth to ninth memory blocks MEMORY BLOCK<6:9>, remain in the same states as those described with reference to FIG. 13A. Therefore, further description will be omitted.

FIGS. 14A to 14C are diagrams for describing another example of the wear leveling operation performed in the memory system in accordance with the embodiment shown in FIG. 12. FIG. 14A, illustrates a state after the first wear leveling operation described with reference to FIGS. 13A and 13B is performed and before a second wear leveling operation is performed.

Since the state of each of the plurality of memory blocks MEMORY BLOCK<0:9> has been described reference to FIGS. 13A and 13B, further detailed description is deemed unnecessary. With reference to FIG. 14A, according a certain criteria, the controller 130 to select the source block and the target block to perform the second wear leveling operation will be described.

In detail, the controller 130 selects, as the source block, a memory block with the maximum value among the respective values included in the first list 1441. For example, the respective values included in the first list 1441 are '100, 78, 78, 80, 80, 1, 2, 2, 100, 80', and the maximum value among them is '100' included as a first turn and '100' included as a ninth turn. In this regard, the value included as the first turn in the first list 1441 is a value corresponding to the zeroth memory block MEMORY BLOCK<0> among the zeroth to ninth memory blocks MEMORY BLOCK<0:9>. The value included as the ninth turn in the first list 1441 is a value corresponding to the eighth memory block MEMORY BLOCK<8> among the zeroth to ninth memory blocks MEMORY BLOCK<0:9>. Therefore, the controller 130 selects, as the source block, either the zeroth memory block MEMORY BLOCK<0> or the eighth memory block MEMORY BLOCK<8> that corresponds to '100' that is the maximum value of the values included in the first list 1441.

In FIG. 14A, the eighth memory block MEMORY BLOCK<8> is preferentially selected as the source block. The reason for this is that although the zeroth memory block MEMORY BLOCK<0> stores the cold data COLD DATA therein as it has been selected as the source block during the first wear leveling operation that has been previously performed, the eighth memory block MEMORY BLOCK<8> remains in the free block state FREE.

In the second wear leveling operation, when the zeroth memory block MEMORY BLOCK<0> is selected as the source block, the second wear leveling operation is performed through a complex process in which the cold data COLD DATA stored in the zeroth memory block MEMORY BLOCK<0> and data stored in a memory block to be selected as the target block are swapped with each other.

However, in the second wear leveling operation, when the eighth memory block MEMORY BLOCK<8> is selected as the source block, the second wear leveling operation is performed through a simple process in which data stored in a memory block to be selected as the target block is copied into the eighth memory block MEMORY BLOCK<8> and then the data of the target block is erased. Thus, no data swap occurs. Therefore, in FIG. 14A, despite the fact that the zeroth memory block MEMORY BLOCK<0> and the eighth memory block MEMORY BLOCK<8> have the same value for the first list 1441, the eighth memory block MEMORY BLOCK<8> is preferentially selected as the source block.

For reference, in the above-mentioned description, although only the operation of determining whether stored data is present has been described as the reason why the eighth memory block MEMORY BLOCK<8> in lieu of the zeroth memory block MEMORY BLOCK<0> is selected as the source block, this is for illustration purposes only. That is, according to a designer's choice, it is possible to select the source block using other methods, for example, using a method of managing a separate list for memory blocks selected as the source block.

The controller 130 selects, as the target block, a memory block that satisfies both the first condition that the target block corresponds to a value in the second list 1442 which is less than 'a difference value' between 'the average value 1444 of all of the values included in the first list 1441' and 'an associated one of the respective values included in the first list 1441', and the second condition that the target block corresponds to 'the smallest value' among the respective values included in the first list 1441.

The controller 130 selects one of the plurality of memory blocks MEMORY BLOCK<0:9> as the target block according to the first operation in which memory blocks that meet the first condition are selected. Then a memory block that meets the second condition is selected. The target block selecting operation is performed as follows.

First, among the respective values included in the second list 1442, values that are less than 'difference values' between 'the average value 1444 of all of the values included in the first list 1441' and 'the respective values included in the first list 1441' are selected.

With regard to the respective values included in the second list 1442, only a value included as a sixth turn has the value '60', and the other values included as first to fifth turns and seventh to tenth turns have the predetermined initial values INIT. Moreover, the value '60' is included as a value of the second list 1442 for the fifth memory block MEMORY BLOCK<5> among the plurality of memory blocks MEMORY BLOCK<0:9>, and the values of the second list 1442 for the other first to fourth memory blocks MEMORY BLOCK<0:4> and sixth to ninth memory blocks MEMORY BLOCK<6:9> are all the predetermined initial values INIT.

The reason for this is that the fifth memory block MEMORY BLOCK<5> has been already selected as the target block during the first wear leveling operation. As described above with reference to FIG. 13A, all of the other zeroth to fourth memory blocks MEMORY BLOCK<0:4> and sixth to ninth memory blocks MEMORY BLOCK<6:9> have never been selected as a target block during the wear leveling operation.

Therefore, in the operation of determining whether each of the zeroth to fourth memory blocks MEMORY BLOCK<0:4> and sixth to ninth memory blocks MEMORY BLOCK<6:9> satisfies the first condition, it can be determined that those blocks are in the satisfied state. However, in the case of the fifth memory block MEMORY BLOCK<5>, it is required to check whether the first condition is satisfied.

In detail, the value of the second list 1442 that corresponds to the fifth memory block MEMORY BLOCK<5> is '60'. This result is described with reference to FIG. 13B. Since 'the average value 1444 of all of the values included in the first list 1441' is '60' at a time when the erase count value included in the first list 1441 for the fifth memory block MEMORY BLOCK<5> is '0', '60' is stored as 'the difference value'.

In this state, with regard to obtaining 'the average value 1444 of all of the values included in the first list 1441' and to check whether the first condition is satisfied, '100, 78, 78, 80, 80, 1, 2, 2, 100, 80' are included in the first list 1441. Therefore, the sum 1443 of all of the values included in the first list 1441 is '601', and the quotient of '601' divided by '10' which is the number of memory blocks MEMORY BLOCK<0:9> is '60' with a remainder of '1'. That is, the average value 1444 of all of the values included in the first list 1441 becomes '60'.

Therefore, 'the difference value' between '1' that is the value of the first list 1441 for the fifth memory block MEMORY BLOCK<5> and '60' that is 'the average value 1444 of all of the values included in the first list 1441' becomes '59'.

The difference value '59' that is determined in this way is less than '60' which is the value of the second list 1442 for the fifth memory block MEMORY BLOCK<5>. In this regard, to satisfy the first condition, it is necessary for 'the difference value' to be greater than '60' that is the value of the second list 1442 for the fifth memory block MEMORY BLOCK<5>. That is, the fifth memory block MEMORY BLOCK<5> fails to meet the first condition. Consequently, the fifth memory block MEMORY BLOCK<5> cannot be selected as the target block in the second wear leveling operation.

Accordingly, only for the zeroth to fourth memory blocks MEMORY BLOCK<0:4> and the sixth to ninth memory blocks MEMORY BLOCK<6:9> that are verified as satisfying the first condition, whether the second condition is satisfied is checked.

In detail, the respective values included in the first list 1441 are '100, 78, 78, 80, 80, 1, 2, 2, 100, 80', and when '1' that is the sixth value corresponding to the fifth memory block MEMORY BLOCK<5> is excluded from those values, the smallest value becomes '2' that is included as a seventh turn and '2' that is included as an eighth turn. The value included as the seventh turn in the first list 1441 is a value corresponding to the sixth memory block MEMORY BLOCK<6> among the zeroth to ninth memory blocks MEMORY BLOCK<0:9>. The value included as the eighth turn in the first list 1441 is a value corresponding to the seventh memory block MEMORY BLOCK<7> among the zeroth to ninth memory blocks MEMORY BLOCK<0:9>.

Therefore, the controller 130 selects, as the target block, either the sixth memory block MEMORY BLOCK<6> or the seventh memory block MEMORY BLOCK<7> that corresponds to '2' that is the relatively smallest value among the values included in the first list 1441 other then the sixth value. Although, in FIG. 14A, the sixth memory block MEMORY BLOCK<6> is selected as the target block, this is for illustration purposes only, and it is to be noted that the seventh memory block MEMORY BLOCK<7> may be selected as the target block according to a designer's choice.

In the case in which the controller 130 selects one of the plurality of memory blocks MEMORY BLOCK<0:9> as the target block according to the second operation of selecting a memory block that meets the second condition and then selecting a memory block that meets the first condition, the target block selecting operation is performed as follows.

First, each of the values included in the first list 1441 is selected as 'a target value' one by one in a sequence in which the selected value sequentially increases from the minimum value.

When a value in the second list 1442 that corresponds to 'the target value' of the first list 1441 selected in the above-mentioned manner is equal to or larger than 'a difference value' between 'the average value 1444 of all of the values included in the first list 1441' and 'an associated one of the respective values included in the first list 1441', 'the target value' of the first list 1441 is ignored, and a subsequent 'target value' is selected from the first list 1441.

However, when the value in the second list 1442 that corresponds to 'the target value' of the first list 1441 is less than 'the difference value' between 'the average value 1444 of all the values included in the first list 1441' and 'the associated one of the values included in the first list 1441', the memory block corresponding to 'the selected target value' of the first list 1441 is selected as the target block.

In detail, the respective values included in the first list 1441 are '100, 78, 78, 80, 80, 1, 2, 2, 100, 80', and the smallest value among them, that is, the minimum value, is '1' which is included as a sixth turn. Since, among the respective values included in the second list 1442, the value included as the sixth turn is verified as being '60', required to check whether the first condition is satisfied.

In this regard, as described in the case of selecting the target block among the plurality of memory blocks MEMORY BLOCK<0:9> according to the first operation, the value '60' that is included as the sixth turn among the respective values included in the second list 1442 is not able to satisfy the first condition.

Therefore, in the respective values included in the first list 1441, the smallest value among the values except '1' that has been previously selected as the minimum value is checked again, and it is possible to select either '2' included as the seventh turn and '2' included as the eighth turn.

In FIG. 14A, may be assumed that '2' included as the seventh turn in the first list 1441 is first selected and, thereafter, '2' included as the eighth turn in the first list 1441 is selected. Since, among the respective values included in the second list 1442, the value included as the seventh turn is verified as being the predetermined initial value INIT, this satisfies the first condition. Therefore, it is not necessary to check the value included as the eighth turn among the respective values included in the second list 1442, and the memory block corresponding to the values included as the seventh turns in the first list 1441 and the second list 1442, that is, the sixth memory block MEMORY BLOCK<6> among the plurality of memory blocks MEMORY BLOCK<0:9>, is selected as the target block.

Referring to FIG. 14B, the first list 1441 and the second list 1442 have changed when the second wear leveling operation in accordance with the first embodiment is performed in the state of FIG. 14A described above.

In detail, the eighth memory block MEMORY BLOCK<8> that has been selected as the source block in FIG. 14A has '100' as the erase count value included in the first list 1441. That is, since existing data that has been stored in the sixth memory block MEMORY BLOCK<6> has been merely copied into the eighth memory block MEMORY BLOCK<8> while the second wear leveling operation is performed, there is no change in the erase count value of the eighth memory block MEMORY BLOCK<8> that is included in the first list 1441.

Furthermore, since the eighth memory block MEMORY BLOCK<8> has been selected as only the source block but never been selected as the target block during the second wear leveling operation, the eighth memory block MEMORY BLOCK<8> has the predetermined initial value INIT as the value included in the second list 1442 in the same manner as in FIG. 14A.

Furthermore, the eighth memory block MEMORY BLOCK<8> is in a state in which cold data COLD DATA is stored therein. That is, while the second wear leveling operation is performed, since the existing cold data COLD DATA that has been stored in the sixth memory block MEMORY BLOCK<6> is copied into the eighth memory block MEMORY BLOCK<8>, the eighth memory block MEMORY BLOCK<8> has cold data COLD DATA therein.

The sixth memory block MEMORY BLOCK<6> has '3' as the erase count value included in the first list 1441. That is, since the existing data that has been stored in the sixth memory block MEMORY BLOCK<6> is erased while the second wear leveling operation is performed, the erase count value of the sixth memory block MEMORY BLOCK<6> '2' that is included in the first list 1441 before the second wear leveling operation is updated to '3' as shown FIG. 14B after the second wear leveling operation.

The sixth memory block MEMORY BLOCK<6> is a block selected as the target block during the second wear leveling operation. The 'difference values' between 'the average value 1444 of all of the values included in the first list 1441' and 'the respective values included in the first list 1441' are included in the second list 1442.

In this regard, the value in the second list 1442 for the sixth memory block MEMORY BLOCK<6> shown in FIG. 14B is a value that is in the same state as that of FIG. 14A, that is, a value that is determined before the first wear leveling operation and after the eighth memory block MEMORY BLOCK<8> is selected as the source block and the sixth memory block MEMORY BLOCK<6> is selected as the target block.

At a time when the erase count value for the sixth memory block MEMORY BLOCK<6> that is included in the first list 1441 is '2', 'a difference value' between it and 'the average value 1444 of all of the values included in the first list 1441' is included as the value of the second list 1442 for the sixth memory block MEMORY BLOCK<6>. In this regard, since 'the average value 1444 of all of the values included in the first list 1441' is '60' and the erase count value of the sixth memory block MEMORY BLOCK<6> that is included in the first list 1441 before the second wear leveling operation is '2', the value of the second list 1442 for the sixth memory block MEMORY BLOCK<6> becomes '58'.

Furthermore, the sixth memory block MEMORY BLOCK<6> is in the free block state FREE in which no data is stored therein. That is, while the second wear leveling operation is performed, since the existing cold data COLD DATA that has been stored in the sixth memory block MEMORY BLOCK<6> is copied into the eighth memory block MEMORY BLOCK<8> and the data of the sixth memory block MEMORY BLOCK<6> is erased, the sixth memory block MEMORY BLOCK<6> remains in the free block state in which no data is stored therein.

Among the plurality of memory blocks MEMORY BLOCK<0:9>, the states of blocks that are selected neither as the source block nor as the target block, that is, the zeroth to fifth memory blocks MEMORY BLOCK<0:5> and the seventh to ninth memory blocks MEMORY BLOCK<7:9>, remain in the same states as those described with reference to FIG. 14A. Therefore, further description thereof is omitted.

Referring to FIG. 14C, the first list 1441 and the second list 1442 have changed after the second wear leveling operation in accordance with the second embodiment is performed according to the conditions described with reference to FIG. 14A based on the state of FIG. 13C described above.

First, with regard to a difference between FIG. 13C and FIG. 14A, the value of the second list 1442 for the fifth memory block MEMORY BLOCK<5> is '60' in FIG. 14A and is '59' in FIG. 13C. The reason for this is due to FIG. 14A being a diagram illustrating a state continuing from the state of FIG. 13B.

Therefore, the operation of selecting the source block and the target block according to the conditions described with reference to FIG. 14A based on the state of FIG. 13C is performed in a state in which the value of the second list 1442 for the fifth memory block MEMORY BLOCK<5> is '59'.

In detail, in the operation of selecting the target block among the plurality of memory blocks MEMORY BLOCK<0:9>, when it is checked whether the first condition for the fifth memory block MEMORY BLOCK<5> is satisfied, it is based on that the value of the second list 1442 for the fifth memory block MEMORY BLOCK<5> is '59'.

In this regard, before the second wear leveling operation is performed as described with reference to FIG. 14A, 'the difference value' between '1' that is the value of the first list 1441 for the fifth memory block MEMORY BLOCK<5> and '60' that is 'the average value 1444 of all of the values included in the first list 1441' becomes '59'.

The difference value '59' that is determined in this way is the same value as '59' that is the value of the second list 1442 for the fifth memory block MEMORY BLOCK<5>. In this regard, to satisfy the first condition, it is required for 'the difference value' to be greater than '59' that is the value of the second list 1442 for the fifth memory block MEMORY BLOCK<5>. Thus, the first condition is not satisfied. Consequently, the fifth memory block MEMORY BLOCK<5> cannot be selected as the target block in the second wear leveling operation.

Therefore, even in the case in which the source block and the target block are selected according to the conditions described with reference to FIG. 14A based on the state of FIG. 13C, the sixth memory block MEMORY BLOCK<6> is selected as the target block, and the eighth memory block MEMORY BLOCK<8> is selected as the source block. The case in which the second wear leveling operation in accordance with the second embodiment is performed will be described with reference to FIG. 14C again.

First, the eighth memory block MEMORY BLOCK<8> that has been selected as the source block in FIG. 14A has '100' as the erase count value included in the first list 1441. That is, since existing data that has been stored in the sixth memory block MEMORY BLOCK<6> has been merely copied into the eighth memory block MEMORY BLOCK<8> while the second wear leveling operation is performed, there is no change in the erase count value of the eighth memory block MEMORY BLOCK<8> that is included in the first list 1441.

Furthermore, since the eighth memory block MEMORY BLOCK<8> has been selected as only the source block but never been selected as the target block during the second wear leveling operation, the eighth memory block MEMORY BLOCK<8> has the predetermined initial value INIT as the value included in the second list 1442 in the same manner as in FIG. 14A.

Furthermore, the eighth memory block MEMORY BLOCK<8> is in a state in which cold data COLD DATA is stored therein. That is, while the second wear leveling operation is performed, since the existing cold data COLD DATA that has been stored in the sixth memory block MEMORY BLOCK<6> has been copied into the eighth memory block MEMORY BLOCK<8>, the eighth memory block MEMORY BLOCK<8> is left in the state in which cold data COLD DATA is stored therein.

The sixth memory block MEMORY BLOCK<6> has '3' as the erase count value included in the first list 1441. That is, since the existing data that has been stored in the sixth memory block MEMORY BLOCK<6> is erased while the second wear leveling operation is performed, the erase count value '2' of the sixth memory block MEMORY BLOCK<6> that is included in the first list 1441 before the second wear leveling operation is updated to '3' as shown in FIG. 14B after the second wear leveling operation.

The sixth memory block MEMORY BLOCK<6> is a block selected as the target block during the second wear leveling operation. The 'difference values' between 'the average value 1444 of all of the values included in the first list 1441' and 'the respective values included in the first list 1441' are included in the second list 1442. In this regard, the value of the second list 1442 for the sixth memory block MEMORY BLOCK<6> shown in FIG. 14C is a value that is determined after the second wear leveling operation is performed.

At a time when the erase count value for the sixth memory block MEMORY BLOCK<6> that is included in the first list 1441 is '3', 'a difference value' between it and 'the average value 1444 of all of the values included in the first list 1441' is included as the value of the second list 1442 for the sixth memory block MEMORY BLOCK<6>. In this regard, since 'the average value 1444 of all of the values included in the first list 1441' is '60' and the erase count value of the sixth memory block MEMORY BLOCK<6> that is included in the first list 1441 before the second wear leveling operation is '3', the value of the second list 1442 for the sixth memory block MEMORY BLOCK<6> becomes '57'.

Furthermore, the sixth memory block MEMORY BLOCK<6> is in the free block state FREE in which no data is stored therein. That is, while the second wear leveling operation is performed, since the existing cold data COLD DATA that has been stored in the sixth memory block MEMORY BLOCK<6> is copied into the eighth memory block MEMORY BLOCK<8> and the data of the sixth memory block MEMORY BLOCK<6> is erased, the sixth memory block MEMORY BLOCK<6> is left in the free block state in which no data is stored therein.

Among the plurality of memory blocks MEMORY BLOCK<0:9>, the states of blocks that are selected neither as the source block nor as the target block, that is, the zeroth to fifth memory blocks MEMORY BLOCK<0:5> and the seventh to ninth memory blocks MEMORY BLOCK<7:9>, remain in the same states as before. Therefore, further description is deemed unnecessary.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including $0^{th}$ to $N-1^{th}$ memory blocks, wherein N is a positive integer; and
   a controller having a first list and a second list,
   wherein the first list includes $0^{th}$ to $N-1^{th}$ erase count values respectively for the $0^{th}$ to $N-1^{th}$ memory blocks,
   wherein the second list includes $0^{th}$ to $N-1^{th}$ difference values respectively for the $0^{th}$ to $N-1^{th}$ memory blocks,
   wherein the controller selects a source block and a target block among the $0^{th}$ to $N-1^{th}$ memory blocks depending on the $0^{th}$ to $N-1^{th}$ erase count values included in the first list and the $0^{th}$ to $N-1^{th}$ difference values included in the second list to perform a wear leveling between the source block and the target block,
   wherein the controller updates an $L^{th}$ erase count value included in the first list, when performing an erase operation on an $L^{th}$ memory block,
   wherein L is an integer selected between 0 to N-1, inclusive,
   wherein the controller updates a $K^{th}$ difference value included in the second list with a difference between an average value of the 0th to N-1th erase count values and the Kth erase count value, after selecting a Kth memory block as the target block,
   wherein K is an integer selected between 0 to N-1, inclusive,
   wherein the controller selects an $M^{th}$ memory block as the target block when first target block condition is met,
   wherein the first target block condition is that the $M^{th}$ difference value included in the second list is less than a difference between the average value of the $0^{th}$ to $N-1^{th}$ erase count values and the $M^{th}$ erase count value included in the first list, and
   wherein M is an integer selected between 0 to N-1, inclusive.

2. The memory system according to claim 1,
   wherein the controller selects the $M^{th}$ memory block as the target block when the first target block condition and second target block condition are met, and
   wherein the second target block condition is that the Mth erase count value is the smallest value among erase count values of memory blocks which meet the first target block condition, each of the memory blocks being one of the 0th to N-1th memory blocks.

3. The memory system according to claim 2,
   wherein the $0^{th}$ to $N-1^{th}$ difference values are set to $0^{th}$ to $N-1^{th}$ initial values, respectively, and
   wherein the controller updates the $M^{th}$ difference value to the difference between the average value of the $0^{th}$ to $N-1^{th}$ erase count values and the $M^{th}$ erase count value, after selecting the $M^{th}$ memory block as the target block and before performing the wear leveling between the source block and the $M^{th}$ memory block selected as the target block.

4. The memory system according to claim 2,
   wherein the $0^{th}$ to $N-1^{th}$ difference values are set to $0^{th}$ to $N-1^{th}$ initial values, respectively, and
   wherein the controller updates the $M^{th}$ difference value to the difference between the average value of the $0^{th}$ to $N-1^{th}$ erase count values and the $M^{th}$ erase count value, after performing the wear leveling between the source block and the $M^{th}$ memory block selected as the target block.

5. The memory system according to claim 1,
   wherein the average value is a quotient which is obtained by dividing a sum of the $0^{th}$ to $N-1^{th}$ erase count values by N, and
   wherein the controller updates the sum of the $0^{th}$ to $N-1^{th}$ erase count values and the average value when performing an erase operation on at least one of the $0^{th}$ to $N-1^{th}$ memory blocks.

6. The memory system according to claim 1,
   wherein the controller determines whether the $K^{th}$ memory block meets a source block condition,
   wherein the controller selects the $K^{th}$ memory block as the source block when the source block condition is met,
   wherein the source block condition includes that a $K^{th}$ erase count value is the greatest among the $0^{th}$ to $N-1^{th}$ erase count values, and
   wherein K is an integer selected between 0 to N-1, inclusive.

7. The memory system according to claim 1,
   wherein the controller determines whether the $K^{th}$ memory block meets a source block condition,
   wherein the controller selects the $K^{th}$ memory block as the source block when the source block condition is met,
   wherein the source block condition includes first and second source block conditions,
   wherein the first source block condition is that a $K^{th}$ erase count value is the greatest among the $0^{th}$ to $N-1^{th}$ erase count values,
   wherein the second source block condition is that the $K^{th}$ memory block is in a free block state, and
   wherein K is an integer selected between 0 to N-1, inclusive.

8. The memory system according to claim 1,
wherein the wear leveling between the source block and the target block comprises:
copying data stored in the target block into the source block; and
erasing the data from the target block.

9. A method of operating a memory system comprising:
generating a first list including $0^{th}$ to $N-1^{th}$ erase count values for the $0^{th}$ to $N-1^{th}$ memory blocks, wherein N is a positive integer;
generating a second list including $0^{th}$ to $N-1^{th}$ difference values for $0^{th}$ to $N-1^{th}$ memory blocks;
selecting a source block and a target block among the $0^{th}$ to $N-1^{th}$ memory blocks depending on the $0^{th}$ to $N-1^{th}$ erase count values in the first list and the $0^{th}$ to $N-1^{th}$ difference values in the second list; and
performing a wear leveling between the source block and the target block,
wherein the controller updates an $L^{th}$ erase count value included in the first list, when performing an erase operation on an Lth memory block,
wherein L is an integer selected between 0 to N-1, inclusive,
wherein the controller updates a Kth difference value included in the second list with a difference between an average value of the 0th to N-1th erase count values and the Kth erase count value, after selecting a Kth memory block as the target block,
wherein K is an integer selected between 0 to N-1, inclusive,
wherein the controller selects the $M^{th}$ memory block as the target block when first target block condition is met,
wherein the first target block condition is that the $M^{th}$ difference value included in the second list is less than a difference between the average value of the $0^{th}$ to $N-1^{th}$ erase count values and the $M^{th}$ erase count value included in the first list, and
wherein M is an integer selected between 0 to N-1, inclusive.

10. The method according to claim 9,
wherein the controller selects the $M^{th}$ memory block as the target block when the first target block condition and second target block condition are met, and
wherein the second target block condition is that the $M^{th}$ erase count value is the smallest value among erase count values of memory blocks which meet the first target block condition, each of the memory blocks being one of the $0^{th}$ to $N-1^{th}$ memory blocks.

11. The method according to claim 10, wherein the updating the $M^{th}$ difference value comprises:
setting the $0^{th}$ to $N-1^{th}$ difference values to $0^{th}$ to $N-1^{th}$ initial values, respectively; and
updating the $M^{th}$ difference value from to the difference between the average value of the $0^{th}$ to $N-1^{th}$ erase count values and the $M^{th}$ erase count value, after selecting the $M^{th}$ memory block as the target block and before performing the wear leveling between the source block and the $M^{th}$ memory block selected as the target block.

12. The method according to claim 10, wherein the updating the $M^{th}$ difference value comprises:
setting the $0^{th}$ to $N-1^{th}$ difference values to $0^{th}$ to $N-1^{th}$ initial values, respectively; and
updating the $M^{th}$ difference value to the difference between the average value of the $0^{th}$ to $N-1^{th}$ erase count values and the $M^{th}$ erase count value, after performing the wear leveling between the source block and the $M^{th}$ memory block selected as the target block.

13. The method according to claim 9, further comprising:
updating a sum of the $0^{th}$ to $N-1^{th}$ erase count values and the average value when performing an erase operation on at least one of the $0^{th}$ to $N-1^{th}$ memory blocks,
wherein the average value is a quotient which is obtained by dividing the sum of the $0^{th}$ to $N-1^{th}$ erase count values by N.

14. The method according to claim 9, wherein the selecting the source block comprises:
determining whether the $K^{th}$ memory block meets a source block condition; and
selecting the $K^{th}$ memory block as the source block when the source block condition is met,
wherein the source block condition includes that a $K^{th}$ erase count value is the greatest among the $0^{th}$ to $N-1^{th}$ erase count values, and K is an integer selected between 0 to N-1, inclusive.

15. The method according to claim 9, wherein the selecting the source block comprises:
determining whether the $K^{th}$ memory block meets a source block condition; and
selecting the $K^{th}$ memory block as the source block when the source block condition is met,
wherein the source block condition includes first and second source block conditions, and
wherein the first source block condition is that a $K^{th}$ erase count value is the greatest among the $0^{th}$ to $N-1^{th}$ erase count values, and the second source block condition is that the $K^{th}$ memory block is in a free block state, and
wherein K is an integer selected between 0 to N-1, inclusive.

16. The method according to claim 9, the performing wear leveling comprises:
copying data stored in the target block into the source block; and
erasing the data from the target block.

* * * * *